United States Patent
Park et al.

(10) Patent No.: US 10,827,607 B2
(45) Date of Patent: Nov. 3, 2020

(54) ELECTRONIC DEVICE INCLUDING RIGID-FLEX CIRCUIT BOARD

(71) Applicant: Samsung Electronics Co., Ltd., Gyeonggi-do (KR)

(72) Inventors: Sungwon Park, Gyeonggi-do (KR); Seungyup Lee, Gyeonggi-do (KR); Hesuk Jung, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/284,619

(22) Filed: Feb. 25, 2019

(65) Prior Publication Data

US 2019/0269009 A1    Aug. 29, 2019

(30) Foreign Application Priority Data

Feb. 23, 2018    (KR) .......................... 10-2018-0022243

(51) Int. Cl.
*H05K 1/02*    (2006.01)
*H05K 1/11*    (2006.01)
(Continued)

(52) U.S. Cl.
CPC ........ *H05K 1/0278* (2013.01); *H04M 1/0277* (2013.01); *H05K 1/0243* (2013.01);
(Continued)

(58) Field of Classification Search
CPC ...... H05K 1/0278; H05K 1/028; H05K 1/189; H05K 2201/058; H05K 2201/09236; H05K 2201/093
See application file for complete search history.

(56) References Cited

U.S. PATENT DOCUMENTS

| 8,044,746 B2 * | 10/2011 | Blair ....................... H01P 3/006 333/247 |
| 9,502,745 B2 * | 11/2016 | Hirayama ............... H01P 1/047 |

(Continued)

FOREIGN PATENT DOCUMENTS

| EP | 2 860 991 | 4/2015 |
| JP | 2007123743 | 5/2007 |

(Continued)

OTHER PUBLICATIONS

International Search Report dated Jun. 10, 2019 issued in counterpart application No. PCT/KR2019/002148, 9 pages.

(Continued)

*Primary Examiner* — Hoa C Nguyen

(74) *Attorney, Agent, or Firm* — The Farrell Law Firm, P.C.

(57) ABSTRACT

An electronic device includes first printed circuit board (PCB) structure including first layer including first conductive strip, second conductive strip electrically separated from first conductive strip and extending at least partially in parallel with first conductive strip, and third conductive strip electrically separated from first conductive strip and extending at least partially in parallel with first conductive strip, such that first conductive strip is between second conductive strip and third conductive strip, and second layer including first conductive layer, first insulating layer interposed between and in contact with first region of first layer and first (Continued)

region of second layer facing first region of first layer, second insulating layer interposed between second region of first layer abutting first region of first layer and second region of second layer abutting first region of second layer while contacting first layer, and third insulating layer interposed between second insulating layer and second region of second layer, while contacting second layer, and being separated from second insulating layer by air gap, and a wireless communication circuit electrically connected to first conductive strip and configured to transmit and/or receive radio frequency (RF) signal.

20 Claims, 16 Drawing Sheets

(51) Int. Cl.
    *H05K 1/03*     (2006.01)
    *H05K 1/18*     (2006.01)
    *H04M 1/02*     (2006.01)

(52) U.S. Cl.
    CPC ............. *H05K 1/036* (2013.01); *H05K 1/115* (2013.01); *H05K 1/189* (2013.01); *H05K 2201/0154* (2013.01); *H05K 2201/058* (2013.01); *H05K 2201/093* (2013.01); *H05K 2201/09236* (2013.01); *H05K 2201/10098* (2013.01)

(56) References Cited

U.S. PATENT DOCUMENTS

| | | |
|---|---|---|
| 2001/0056174 A1 | 12/2001 | Okada et al. |
| 2005/0057327 A1 | 3/2005 | Kwon et al. |
| 2009/0026168 A1 | 1/2009 | Tsai et al. |
| 2010/0201462 A1 | 8/2010 | Blair et al. |
| 2011/0075374 A1* | 3/2011 | Kang .................. H05K 3/4641 361/704 |
| 2014/0003007 A1* | 1/2014 | Shiroki ................... H01B 7/08 361/752 |
| 2017/0156205 A1* | 6/2017 | Liu ....................... H05K 1/0278 |
| 2017/0290184 A1 | 10/2017 | Kim et al. |
| 2018/0309182 A1 | 10/2018 | Iida et al. |

FOREIGN PATENT DOCUMENTS

| | | |
|---|---|---|
| JP | 56-17374 | 11/2014 |
| KR | 10-2005-0027461 | 3/2005 |
| KR | 1020100079336 | 7/2010 |
| WO | WO 2017/130731 | 8/2017 |

OTHER PUBLICATIONS

Steve Hageman, "Via Spacing on High-Performance PCBs", EDN Network, XP055642825, Feb. 6, 2013, 5 pages.

European Search Report dated Dec. 2, 2019 issued in counterpart application No. 19158802.9-1203, 30 pages.

\* cited by examiner

ELECTRONIC DEVICE INCLUDING RIGID-FLEX CIRCUIT BOARD

CROSS-REFERENCE TO RELATED APPLICATION(S)

This application is based on and claims priority under 35 U.S.C. § 119 to Korean Patent Application No. 10-2018-0022243, filed on Feb. 23, 2018, in the Korean Intellectual Property Office, the disclosure of which is incorporated by herein reference in its entirety.

BACKGROUND

1. Field

The present disclosure relates generally to electronic devices with a rigid-flex circuit board, and more particularly, to a rigid-flex circuit board with a signal line and ground regions on both sides of, and under, the signal line on some conductive layers in a flexible circuit board region in order to reduce impedance variations.

2. Description of Related Art

Electronic devices may output stored information as sounds or images. As electronic devices are highly integrated, and high-speed, high-volume wireless communication becomes commonplace, electronic devices, such as mobile communication terminals, have recently been equipped with various functions. For example, electronic devices come with integrated functionality, including entertainment functions, such as playing video games, multimedia functions, such as replaying music/videos, communication and security functions for mobile banking, and scheduling or e-wallet functions.

As the focus for electronic devices has shifted to being slimmer, more compact, and denser, printed circuit boards (PCBs) for electronic devices are required to be more integrated and lightweight. PCBs may be classified as rigid, flexible, and rigid-flex, which is a mix of rigid and flexible, depending on their physical traits.

With the demand for integration, rigid-flex PCBs may come in a multi-layered structure which is a combination of single-sided PCBs and a double-sided PCB. For example, a rigid-flex PCB may be structured with a double-sided PCB having a circuit layer and an insulating layer and single-sided PCBs having a circuit layer and an insulating layer and disposed on the top and bottom of the double-sided PCB.

Multi-layered rigid-flex PCBs have brought about integration of circuitry. In a flexible protection cover region, multiple layers are stacked over one another without being bonded together. When the flexible PCB region is bent or deformed, some of the layers may be reversely bent due to a lack of bonding. The reverse bending may increase loss as per impedance variations in the high-speed wiring signal line (e.g., the radio frequency (RF) signal line) on the flexible PCB region.

SUMMARY

An aspect of the present disclosure provides an electronic device with a rigid-flex circuit board implemented to reduce RF impedance variations even though the flexible circuit board region is bent or deformed to reduce loss.

Another aspect of the present disclosure provides a rigid-flex circuit board with a signal line and ground regions on both sides of, and under, the signal line on some conductive layers in the flexible circuit board region in order to reduce impedance variations.

In accordance with an aspect of the present disclosure, an electronic device is provided. The electronic device includes a first PCB structure including a first layer including a first conductive strip, a second conductive strip electrically separated from the first conductive strip and extending at least partially in parallel with the first conductive strip, and a third conductive strip electrically separated from the first conductive strip and extending at least partially in parallel with the first conductive strip, such that the first conductive strip is between the second conductive strip and the third conductive strip, and a second layer including a first conductive layer, a first insulating layer interposed between and in contact with a first region of the first layer and a first region of the second layer facing the first region of the first layer, a second insulating layer interposed between a second region of the first layer abutting the first region of the first layer and a second region of the second layer abutting the first region of the second layer, while contacting the first layer, and a third insulating layer interposed between the second insulating layer and the second region of the second layer, while contacting the second layer, and being separated from the second insulating layer by an air gap, and a wireless communication circuit electrically connected to the first conductive strip and configured to transmit and/or receive an RF signal.

In accordance with an aspect of the present, an electronic device is provided. The electronic device includes a rigid circuit board and a flexible circuit board extending from the rigid circuit board and including a plurality of conductive layers and at least one insulating layer disposed between the plurality of conductive layers, wherein the flexible circuit board includes a first layer including a signal line and a ground line spaced apart from the signal line, and a second layer forming a ground disposed to face the first layer with at, least one insulating layer disposed therebetween, and wherein the rigid circuit board includes at least one conductive via disposed adjacent the flexible circuit board.

In accordance with an aspect of the present disclosure, a circuit board is provided. The circuit board includes a rigid circuit board including at least one conductive via and a flexible circuit board extending from the rigid circuit board and including a plurality of conductive layers, wherein the flexible circuit board includes a first conductive layer including a disconnected part along a center line in a lengthwise direction, a second conductive layer including a signal line and ground lines spaced apart from each other on both sides of the signal line and formed to cause the disconnected part to overlap the signal line, and a third conductive layer disposed under the second conductive layer as a ground plane.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
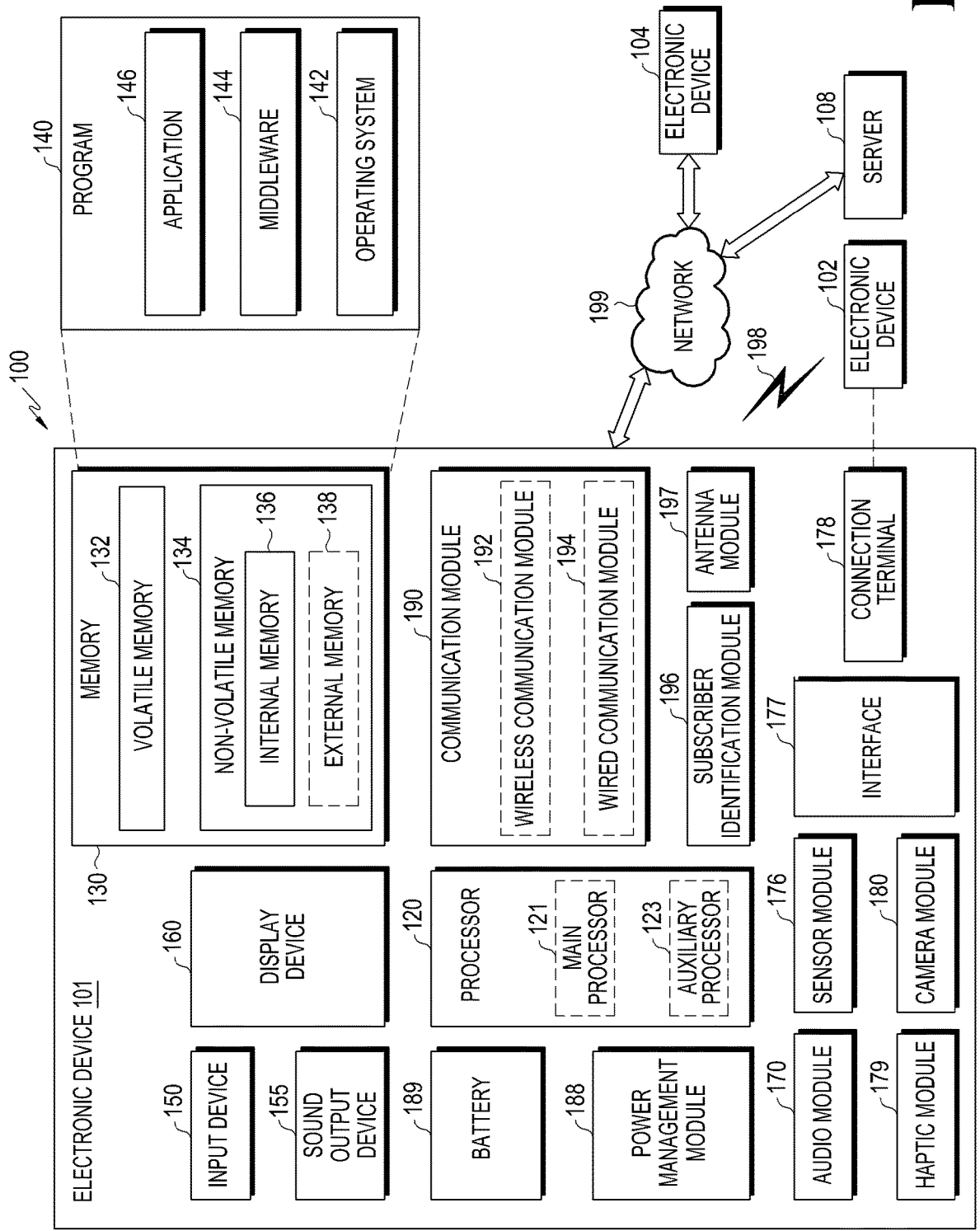
FIG. 1 is a block diagram illustrating an electronic device in a network environment according to an embodiment.

FIG. 1 is a block diagram of an electronic device 101 in a network environment 100 according to an embodiment of the present disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. The electronic device 101 may include a processor 120, memory 130, an input device 150, a sound output device 155, a display device 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, e.g., software (e.g., a program 140) to control at least one other component (e.g., a hardware or software component) of the electronic device 101 connected with the processor 120 and may process or compute various data. According to one embodiment, as at least part of data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of, the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

The connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or wireless communication channel between the electronic device 101 and an external electronic device (e.g., the electronic device 102, the electronic device 104, or the server 108) and performing communication through the established communication channel. The communication module 190 may include one or more CPs that are operable independently from the processor 120 (e.g., the AP) and supports a direct (e.g., a wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network (e.g., a LAN or a wide area network (WAN)). These various types of communication modules may be implemented as a single component (e.g., a single integrated circuit or chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices 102, 104, or 108 to perform at least part of the function or the service. The one or more external electronic devices 102, 104, or 108 receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device 101 according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic device 101 is not limited to the above-listed embodiments.

Various embodiments of the present disclosure and the terms used therein are not intended to limit the present disclosure but include various changes, equivalents, or replacements for a corresponding embodiment. With regard to the description of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," "first" and "second" may be used to simply distinguish a corresponding component from another component, but does is not intended to limit the components in another aspect (e.g., importance or order). If an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, a module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor 120 of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include code made by a complier or code executable by an interpreter. The machine-readable storage medium may be provided in the form of a non-transitory storage medium. Wherein, the term "non-transitory" simply indicates that the storage medium is a tangible device, but does not include a signal (e.g., an electromagnetic wave), where this term does not differentiate between where data is semi-permanently stored in the storage medium and where the data is temporarily stored in the storage medium.

A method according to an embodiment of the present disclosure may be included and provided in a computer program product. Computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
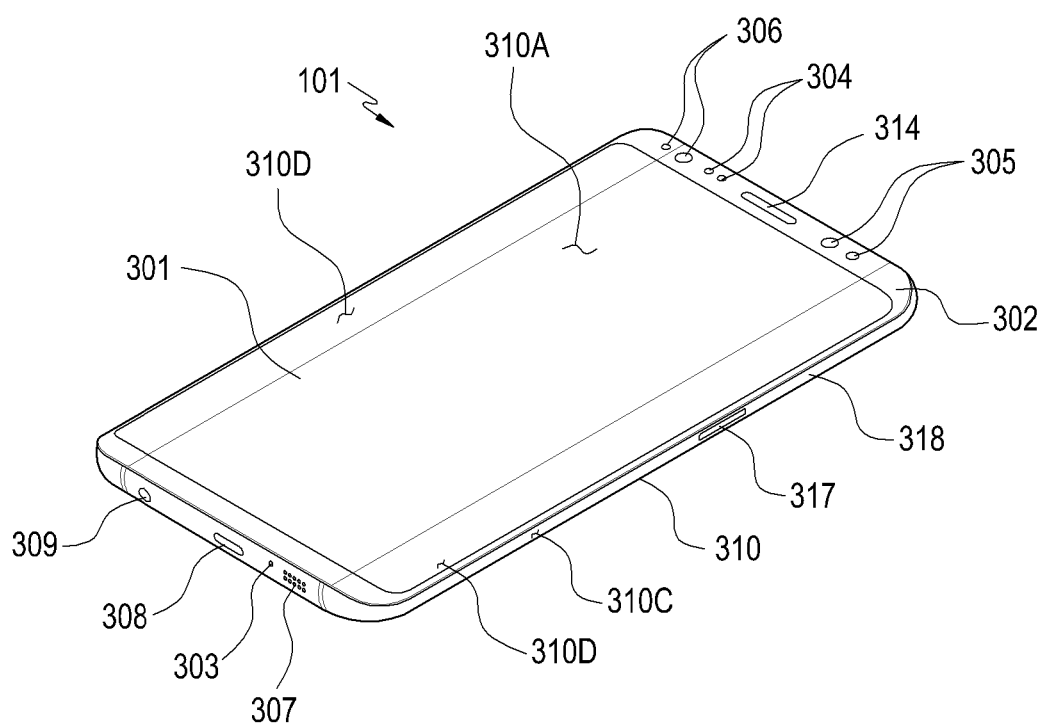
FIG. 2 is a front perspective view illustrating an electronic device according to an embodiment.
Figure 3:
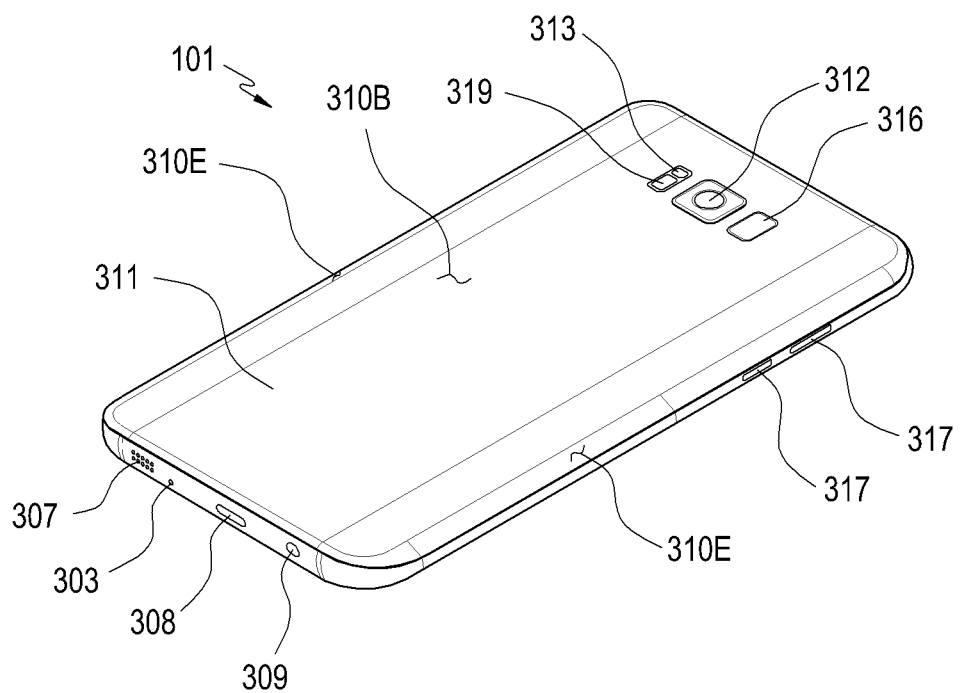
FIG. 3 is a rear perspective view illustrating an electronic device according to an embodiment.

FIG. 2 is a front perspective view of an electronic device 101 according to an embodiment. FIG. 3 is a rear perspective view of an electronic device 101 according to an embodiment.

Referring to FIGS. 2 and 3, according to an embodiment, an electronic device 101 may include a housing 310 with a first (or front) surface 310A, a second (or rear) surface 310B, and a side surface 310C surrounding a space between the first surface 310A and the second surface 310B. The housing 310 may denote a structure forming part of the first surface 310A, the second surface 310B, and the side surface 310C of FIG. 2. At least part of the first surface 310A may have a substantially transparent front plate 302 (e.g., a glass plate or polymer plate including various coat layers). The second surface 310B may be formed of a substantially opaque rear plate 311. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a side member) 318 that couples to the front plate 302 and the rear plate 311 and includes a metal and/or polymer. The rear plate 311 and the side bezel plate 318 may be integrally formed together and include the same material (e.g., a metal, such as aluminum).

The front plate 302 may include two first regions 310D, which seamlessly and bendingly extend from the first surface 310A to the rear plate, on both the long edges of the front plate 302. The rear plate 311 may include second regions 310E, which seamlessly and bendingly extend from the second surface 310B to the front plate, on both the long edges. According to an embodiment, the front plate 302 (or the rear plate 311) may include only one of the first regions 310 (or the second regions 310E). Alternatively, the first regions 310D or the second regions 301E may partially be excluded. The side bezel structure 318 may have a first thickness (or width) for sides that do not have the first regions 310D or the second regions 310E and a second thickness, which is less than the first thickness, for sides that have the first regions 310D or the second regions 310E.

The electronic device 101 may include at least one or more of a display 301, audio modules 303, 307, and 314, sensor modules 304, 316, and 319, camera modules 305, 312, and 313, a key input device 317, a light emitting device 306, and connector holes 308 and 309. The electronic device 101 may exclude at least one (e.g., the key input device 317 or the light emitting device 306) of the components or may add other components.

The display 301 may be exposed through the top of, e.g., the front plate 302. According to an embodiment, at least a portion of the display 301 may be exposed through the front plate 302 forming the first surface 310A and the first regions 310D of the side surface 310C. The edge of the display 301 may be formed to be substantially the same in shape as an adjacent outer edge of the front plate 302. The interval between the outer edge of the display 301 and the outer edge of the front plate 302 may remain substantially even to give a larger area of exposure of the display 301.

According to an embodiment, the screen display region of the display 301 may have a recess or opening in a portion thereof, and at least one or more of the audio module 314, sensor module 304, camera module 305, and light emitting device 306 may be aligned with the recess or opening. At least one or more of the audio module 314, sensor module 304, camera module 305, fingerprint sensor 316, and light emitting device 306 may be included on the rear surface 310B of the screen display region of the display 301. The display 301 may be disposed to be coupled with, or adjacent, a touch detecting circuit, a pressure sensor capable of measuring the strength (pressure) of touches, and/or a digitizer for detecting a magnetic field-type stylus pen. At least part of the sensor modules 304 and 319 and/or at least part of the key input device 317 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. The speaker holes 307 and 314 and the microphone hole 303 may be implemented as a single hole, or speakers may be rested without the speaker holes 307 and 314 (e.g., piezo speakers).

The sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (e.g., a fingerprint sensor) disposed on the first surface 310A of the housing 310 and/or a third sensor module 316 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 101 may further include sensor modules, e.g., at least one of a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, or an illuminance sensor 304.

The camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an IR camera, a wide-angle lens, and a telescopic lens) and image sensors may be disposed on one surface of the electronic device 101.

The key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. The key input device may include the sensor module 316 disposed on the second surface 310B of the housing 310.

The light emitting device 306 may be disposed on, e.g., the first surface 310A of the housing 310. The light emitting device 306 may provide, e.g., information about the state of the electronic device 101 in the form of light. According to an embodiment, the light emitting device 306 may provide a light source that interacts with, e.g., the camera module 305. The light emitting device 306 may include, e.g., an LED, an IR LED, or a xenon lamp.

The connector holes 308 and 309 may include a first connector hole 308 for receiving a connector (e.g., a USB connector) for transmitting or receiving power and/or data to/from an external electronic device and/or a second connector hole 309 (e.g., an earphone jack) for receiving a connector for transmitting or receiving audio signals to/from the external electronic device.

Figure 4:
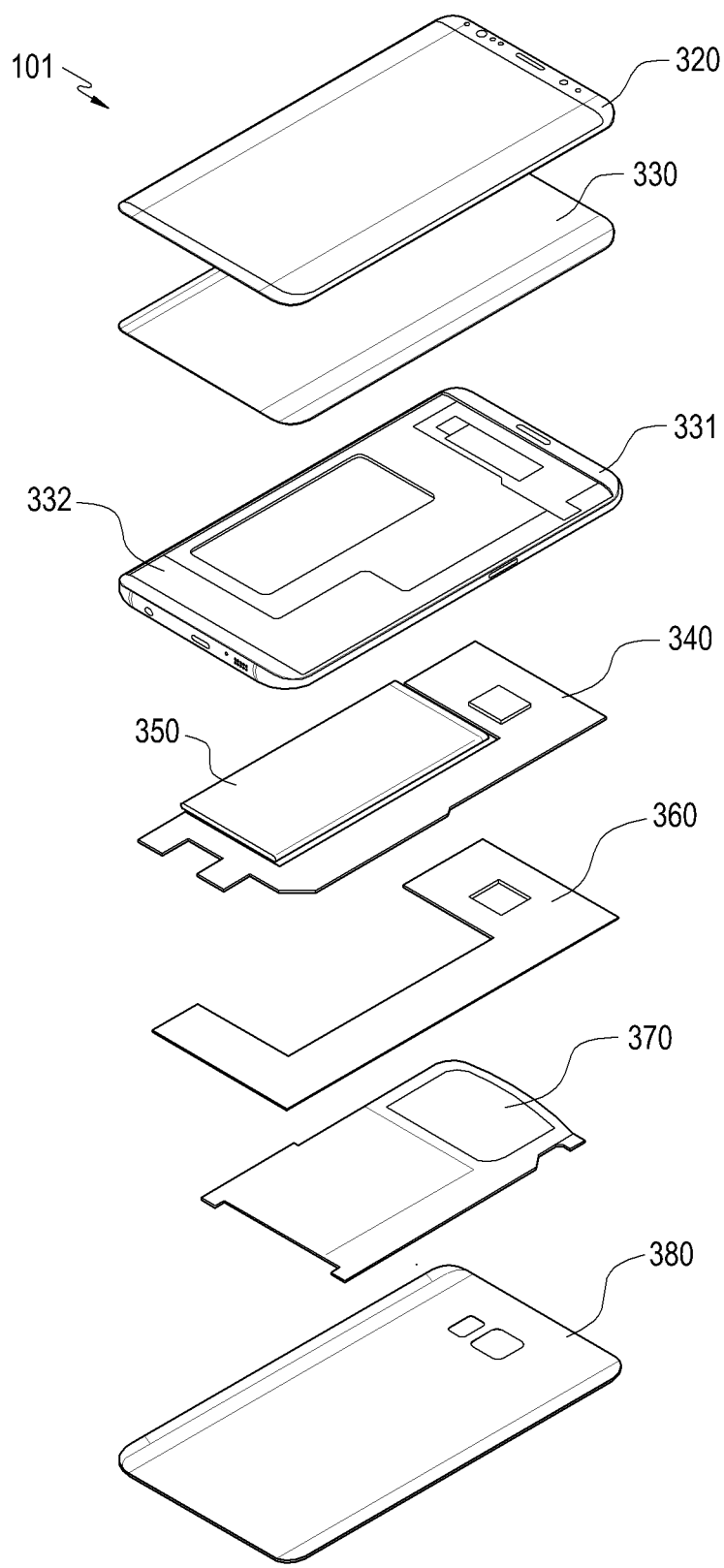
FIG. 4 is an exploded perspective view illustrating an electronic device according to an embodiment.

FIG. 4 is an exploded perspective view of the electronic device 101 according to an embodiment.

Referring to FIG. 4, the electronic device 101 may include a side bezel structure 331, a first supporting member 332 (e.g., a bracket), a front plate 320, a display 330, a PCB 340, a battery 350, a second supporting member 360 (e.g., a rear case), an antenna 370, and a rear plate 380. The electronic device 101 may exclude at least one (e.g., the first supporting member 332 or the second supporting member 360) of the components or may add other components. At least one of the components of the electronic device 101 may be the same as, or similar to, at least one of the components of the electronic device 101 and no duplicate description thereof is included below.

The first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the PCB 340 may be joined onto the opposite surface of the first supporting member 311. A processor, memory, and/or interface may be mounted on the PCB 340. The processor may include one or more of, e.g., a CPU, an AP, a graphic processing device, an ISP, a sensor hub processor, or a CP.

The memory may include, e.g., a volatile or non-volatile memory.

The interface may include, e.g., an HDMI, a USB interface, an SD card interface, and/or an audio interface. The interface may electrically or physically connect, e.g., the electronic device 101 with an external electronic device and may include a USB connector, an SD card/multimedia card (MMC) connector, or an audio connector.

The battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the PCB 340. The battery 350 may be integrated or detachably disposed inside the electronic device 101.

The antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 331 and/or the first supporting member 332.

Figure 5A:
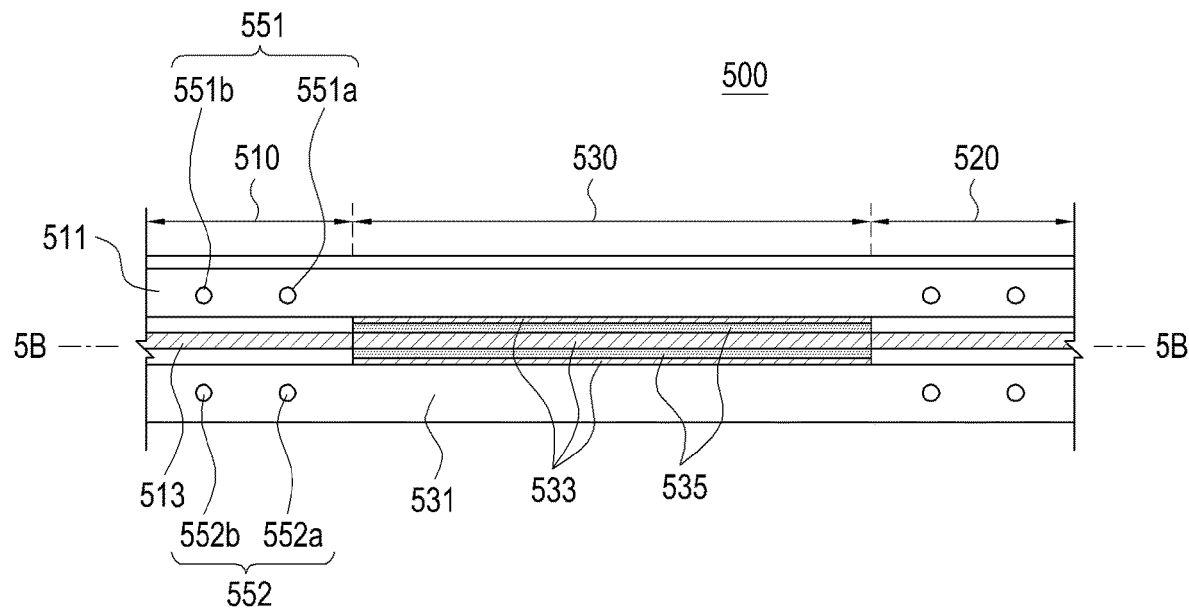
FIG. 5A is a plan view illustrating a portion of a rigid-flex circuit board according to an embodiment.
Figure 5B:
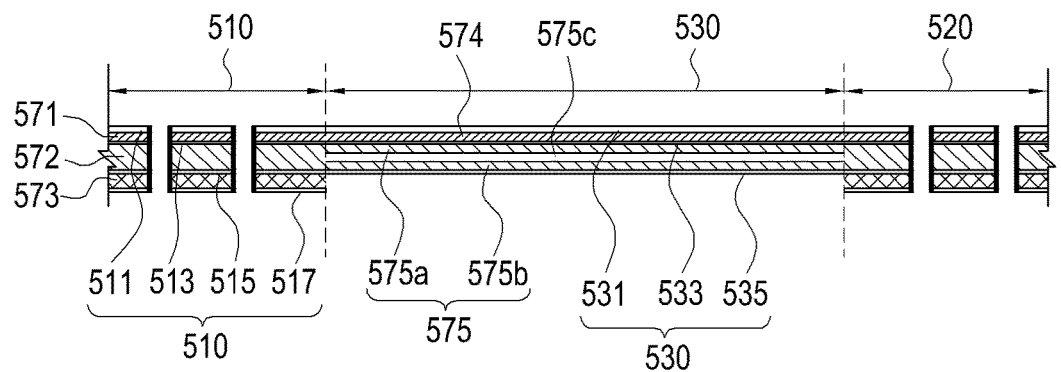
FIG. 5B is a cross-sectional view of the rigid-flex circuit board of FIG. 5A taken along line 5B.

FIG. 5A is a plan view of a portion of a rigid-flex circuit board 500 according to an embodiment. FIG. 5B is a cross-sectional view of the rigid-flex circuit board 500 taken along line 5B of FIG. 5A. Referring to FIGS. 5A and 5B, the rigid-flex circuit board 500 may include a flexible circuit board 530 and rigid circuit boards 510 and 520 extending from both sides of the flexible circuit board 530, with the flexible circuit board 530 disposed therebetween. The structure of the rigid-flex circuit board 500 of FIGS. 5A and 5B may be the same in whole or in part as the structure of the circuit board 340 of FIG. 4. Insulating layers are excluded from where conductive vias are disposed so that the conductive vias are shown, even though the insulating layers are not supposed to be excluded in practice.

The rigid-flex circuit board 500 may have a multi-layered structure with the rigid circuit boards 510 and 520 which form a first region and a third region of the rigid-flex circuit board 500 and the flexible circuit board 530 which forms a second region of the rigid-flex circuit board 500. For example, the rigid-flex circuit board 500 may include a first layer and a second layer. The first layer may extend from the first region through the second region to the third region and have a plurality of conductive strips. The plurality of conductive strips may include a first conductive strip (e.g., the first signal line 513c of FIG. 6B and the second signal line 533c of FIG. 7B), a second conductive strip (e.g., the second-first region 513a of FIG. 6B and the second-first ground line 533a of FIG. 7B), and a third conductive strip (e.g., the second-second region 513b of FIG. 6B and the second-second ground line 533b of FIG. 7B). The second layer may extend from the first region through the second region to the third region and be overlaid on the first layer. The second layer may include at least one conductive layer (e.g., the third conductive layer 515 and the seventh conductive layer 535 of FIG. 5B).

The rigid circuit boards 510 and 520 of the rigid-flex circuit board 500 may include a first rigid circuit board 510 and a second rigid circuit board 520. A flexible circuit board 530 may be disposed between the first rigid circuit board 510 and the second rigid circuit board 520.

The first rigid circuit board 510 and the second rigid circuit board 520 may form substantially the same layer and the same structure. Hereinafter, the first rigid circuit board 510 is described, and the description of the first rigid circuit board 510 may apply to the second rigid circuit board 520.

However, embodiments of the disclosure are not limited to the structure. For example, the rigid-flex circuit board 500 may be formed with various layouts and layers, such as a rigid circuit board being disposed between a plurality of flexible circuit boards. For example, the rigid-flex circuit board 500 may be produced in an 8-6-8 structure (of eight rigid circuit boards and six flexible circuit boards) or an 8-5-8 structure (of eight rigid circuit boards and five flexible circuit boards).

In a cross-sectional view of the rigid-flex circuit board 500 taken along the lengthwise direction 5B, the rigid-flex circuit board 500 may have a plurality of layers stacked on one another. For example, the rigid-flex circuit board 500 may include a plurality of conductive layers and insulating layers disposed between the plurality of conductive layers.

The first rigid circuit board 510 and the flexible circuit board 530 may be formed in different layers. For example, the first rigid circuit board 510 may include a first conductive layer 511, a second conductive layer 513, a third conductive layer 515, or a fourth conductive layer 517 and may be formed with a layer including at least one signal line (e.g., the second conductive layer 513) and a layer (e.g., the first conductive layer 511, the third conductive layer 515, or the fourth conductive layer 517) including at least one ground. A partial structure (e.g., the first signal line 513c of FIG. 6A) of the second conductive layer 513 and the ground structure of the fourth conductive layer 517 spaced apart from the top and bottom of the partial structure of the second conductive layer 513 may provide a micro strip type of line path. For example, the flexible circuit board 530 may include a fifth conductive layer 531, a sixth conductive layer 533, or a seventh conductive layer 535 and be formed with a layer including at least one signal line (e.g., the sixth conductive layer 533) and a layer including at least one ground (e.g., the fifth conductive layer 531 or the seventh conductive layer 535).

The first rigid circuit board 510 and the flexible circuit board 530 may have a first insulating layer 571, a second insulating layer 572, or a third insulating layer 573 stacked thereon to form a build-up layer. For example, the first rigid circuit board 510 and the flexible circuit board 530 may be formed of a stacked plate that includes a thin metallic plate (e.g., copper (CU) plate) disposed on a base layer formed of, e.g., polyimide (PI), such as a flexible copper clad laminate (FCCL). For example, a thin copper plate may be layered on the top or bottom of the PI-based base layer, and a copper-plated film may then be layered thereon. For example, an ink layer may be coated on the top of the copper-plated film, protecting the circuitry.

The first rigid circuit board 510 may include the first insulating layer 571 disposed to be in contact between the first conductive layer 511 and the second conductive layer 513, the second insulating layer 572 disposed to be in contact between the second conductive layer 513 and the third conductive layer 515, and a third insulating layer 573 disposed to be in contact between the third conductive layer 515 and the fourth conductive layer 517. For example, the flexible circuit board 530 may include a fourth insulating layer 574 disposed to be in contact between the fifth conductive layer 531 and the sixth conductive layer 533 and a fifth insulating layer 575 disposed to be in contact between the sixth conductive layer 533 and the seventh conductive layer 535. The fifth insulating layer 575 may include, e.g., a fifth-first insulating layer 575a and a fifth-second insulating layer 575b that may be separated from each other by an air gap 575c.

The first rigid circuit board 510 may be restricted on warps or deformation as compared with the flexible circuit board. For example, at least part of the first insulating layer 571, the second insulating layer 572, or the third insulating layer 573 may be a prepreg obtained by impregnating a glass fabric or glass mat with a catalyst-applied unsaturated polyester resin. For example, at least part of the first insulating layer 571, the second insulating layer 572, or the third insulating layer 573 of the first rigid circuit board 510 may be formed with a plurality of layers by repeating the process of applying an adhesive material and then compressing an insulating layer and a thin copper plate, such as a prepreg.

The first rigid circuit board 510 may include a plurality of conductive vias 551 and 552. For example, a region of the first rigid circuit board 510 may include a via hole for at least one first conductive via 551. The first conductive vias 551 may include a first-first conductive via 551a and a first-second conductive via 551b each of which may pass through from the first conductive layer 511 to the fourth conductive layer 517, conducting electric current. For example, another region of the first rigid circuit board 510 may include a via hole for at least one second conductive via 552. The second conductive via 552 may include a second-first conductive via 552a and a second-second conductive via 552b each of which may pass through from the first conductive layer 511 to the fourth conductive layer 517, conducting electric current.

At least part of the fourth insulating layer 574 or the fifth insulating layer 575 of the flexible circuit board 530 may include a coverlay. The coverlay may include a coverlay film and cover resin layers layered on both surfaces of the coverlay film. The coverlay film may include a PI resin formed of an electrical insulating layer. For example, the PI resin may be a high thermal-resistant resin produced by preparing a polyamic acid derivative by solution-polymerizing aromatic dianhydride with aromatic diamine or aromatic diisocyanate and ring-closing dehydrating to imidize it at high temperature to imidize. Thus, the PI resin, as an insoluble, infusible ultra-high thermal-resistant resin, may have superior properties in thermal oxidation resistance, thermal resistance, radiation resistance, low-temperature characteristics, or chemical resistance.

The first insulating layer may be formed of a first material, the second insulating layer of a second material different from the first material, and the third insulating layer of a third material different from at least one of the first material and the second material. The fourth insulating layer may be formed of a fourth material different from at least one of the first material to the third material, and the fifth insulating layer of a fifth material different from at least one of the first material to the fourth material. For example, the first material may contain polypropylene glycol (PPG), the second material may contain a black coverlay, the third material may contain a coverlay, and the fourth material may include polyimide. For example, the black coverlay of the second material may include a material obtained by adding carbon black to PI and a bonding sheet, and the coverlay of the third material may include PI and a bonding sheet.

Figure 6A:
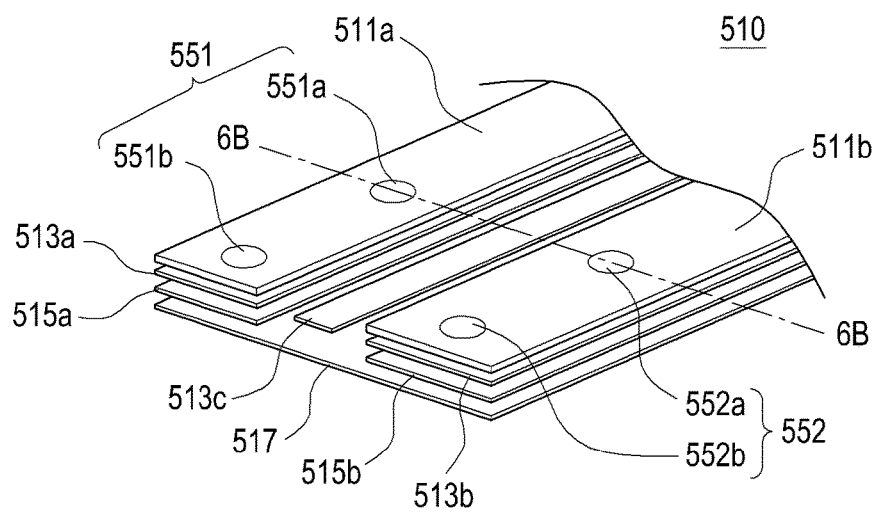
FIG. 6A is a perspective view illustrating a first rigid circuit board of a rigid-flex circuit board according to an embodiment.
Figure 6B:
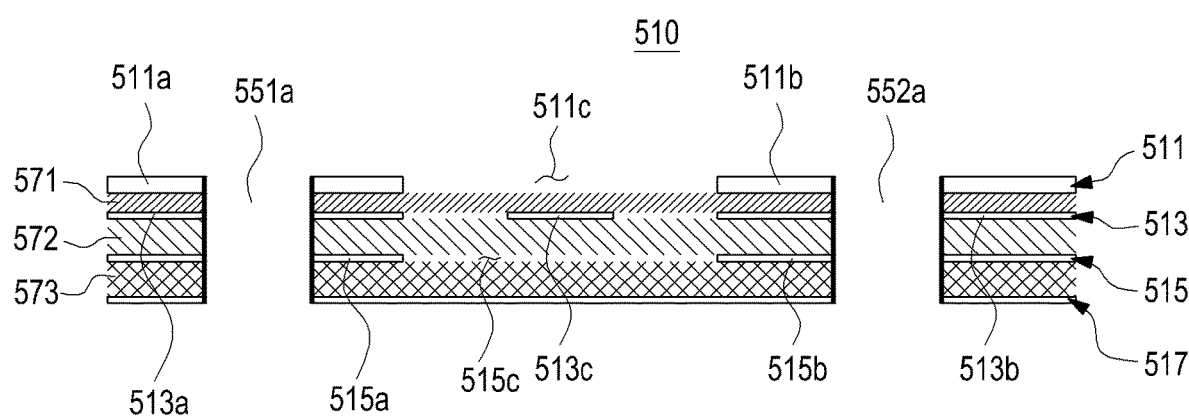
FIG. 6B is a cross-sectional view of the first rigid circuit board of FIG. 6A taken along line 6B.

FIG. 6A is a perspective view of the first rigid circuit board 510 of the rigid-flex circuit board 500 according to an embodiment. FIG. 6B is a cross-sectional view of the first rigid circuit board 510 of FIG. 6A taken along line 6B.

Referring to FIGS. 6A and 6B, the rigid-flex circuit board 500 may include a flexible circuit board and rigid circuit boards extending from both sides of the flexible circuit board, with the flexible circuit board disposed therebetween. The structure of the first rigid circuit board 510 of FIG. 6A and FIG. 6B may be the same in whole or in part as the structure of the rigid circuit boards 510 and 520 of FIG. 5A and FIG. 5B.

The first rigid circuit board 510 of the rigid-flex circuit board 500 may include a first conductive layer 511, a second conductive layer 513, a third conductive layer 515, or a fourth conductive layer 517 and a first insulating layer 571, a second insulating layer 572, or a third insulating layer 573 between the plurality of conductive layers. For example, the first rigid circuit board 510 may include the first insulating layer 571 disposed to be in contact between the first conductive layer 511 and the second conductive layer 513, the second insulating layer 572 disposed to be in contact between the second conductive layer 513 and the third conductive layer 515, and the third insulating layer 573 disposed to be in contact between the third conductive layer 515 and the fourth conductive layer 517.

The first rigid circuit board 510 may include the first conductive layer 511, the second conductive layer 513, the third conductive layer 515, or the fourth conductive layer 517. For example, the first conductive layer 511, the second conductive layer 513, the third conductive layer 515, or the fourth conductive layer 517 may have a different thickness or structure. However, the number of the conductive layers of the first rigid circuit board 510 is not limited thereto, and the first rigid circuit board 510 may have four or more layers.

The first conductive layer 511 of the first rigid circuit board 510 may have a disconnected part 511c where it at least partially overlaps a first signal line 513c in the second conductive layer 513, providing a ground plane. For example, the first disconnected part 511c of the first conductive layer 511 may extend up to the flexible circuit region in a cut shape along the lengthwise direction of the first conductive layer 511.

The first conductive layer 511 may include a first-first region 511a and a first-second region 511b disposed in the shape of lines parallel with each other, with the first disconnected part 511c disposed therebetween. The first-first region 511a may include a via hole for at least one first conductive via 551. The first-second region 511b may include a via hole for at least one second conductive via 552. The first conductive vias 551 may include a first-first conductive via 551a and a first-second conductive via 551b each of which may pass through the first-first region 511a of the first conductive layer 511 through the fourth conductive layer 517 to conduct electric current. The second conductive vias 552 may include a second-first conductive via 552a and a second-second conductive via 552b each of which may pass through the first-second region 511b of the first conductive layer 511 through the fourth conductive layer 517 to conduct electric current. The first conductive layer 511 may be excluded depending on the structure of the rigid-flex circuit board 500.

The second conductive layer 513 of the first rigid circuit board 510 may include a first signal line 513c (e.g., a first conductive strip) and a second-first region 513a and a second-second region 513b (e.g., the second and third conductive strips) disposed on both sides of the first signal line 513c. The first signal line 513c may be an RF signal line and, as viewed from above the first conductive layer 511, overlap at least part of the first disconnected part 511c of the first conductive layer 511. The first signal line 513c may extend from the first rigid circuit board 510 through the flexible circuit board 530 to the second rigid circuit board 520.

The second-first region 513a and the second-second region 513b may extend along the lengthwise direction of the second conductive layer 513 and with the width corresponding to each of the first-first region 511a and the first-second region 511b of the first conductive layer 511. At least part of the second-first region 513a and the second-second region 513b may provide a ground for the first signal line 513c. For example, regions of the second-first region 513a and the second-second region 513b which are positioned adjacent to the flexible circuit board 530 may provide a ground plane for the RF signal line.

The second-first region 513a and the second-second region 513b may be spaced apart from the first signal line 513c. For example, the interval between the second-first region 513a and the first signal line 513c and/or the interval between the second-second region 513b and the first signal line 513c may range from 0.05 mm to 0.12 mm. For example, the interval between the second-first region 513a and the first signal line 513c and/or the interval between the second-second region 513b and the first signal line 513c may be about 0.1 mm.

The second-first region 513a and the second-second region 513b may connect through the first conductive via 551 or the second conductive via 552 to the first-first region 511a or the first-second region 511b of the first conductive layer 511 disposed on the top of the second conductive layer 513, passing through and conducting current down to the fourth conductive layer 517.

The third conductive layer 515 of the first rigid circuit board 510 may include a second disconnected part 515c, a third-first region 515a, and a third-second region 515b. The third-first region 515a may face the second-first region 513a, and the third-second region 515b may face the second-second region 513b.

The second disconnected part 515c of the third conductive layer 515 may extend up to the flexible circuit region in a cut shape along the lengthwise direction. The third-first region 515a and the third-second region 515b may extend to the ground line (e.g., the seventh conductive layer 535 of FIG. 7B) of the flexible circuit board 530, stably supporting the seventh conductive layer 535.

The third-first region 515a and the third-second region 515b may connect from the third conductive layer 515 to the first-first region 511a or the first-second region 511b of the first conductive layer 511 and the second-first region 513a or the second-second region 513b of the second conductive layer 513 through the first conductive via 551 or the second conductive via 552, passing through and conducting current to the fourth conductive layer 517.

The second conductive layer 513 and the third conductive layer 515 may be disposed between the fourth conductive layer 517 and the first conductive layer 511 of the first rigid circuit board 510. The fourth conductive layer 517 may substantially support the first rigid circuit board 510. The fourth conductive layer 517 may provide a ground plane for the first signal line 513c of the second conductive layer 513.

The structure of the fourth conductive layer 517, e.g., the ground structure spaced apart from the top and bottom of the first signal line 513c, may provide a line path of a micro strip type.

The fourth conductive layer 517 may include a via hole to form the first conductive via 551 or the second conductive via 552. The via hole of the fourth conductive layer 517 may electrically connect with the via hole of each layer, conducting current.

The first conductive via 551 or the second conductive via 552 may be disposed within a ¼ wavelength (¼λ) from the border surface of the rigid circuit boards 510 and 520 and the flexible circuit board 530. However, the configuration of the first conductive via 551 or the second conductive via 552 is not limited to passing through all of the layers but may instead be disposed in a different position of each conductive layer (e.g., not to face each other) to electrically connect the conductive layers of the first rigid circuit board 510 (refer to FIG. 13B).

Figure 7A:
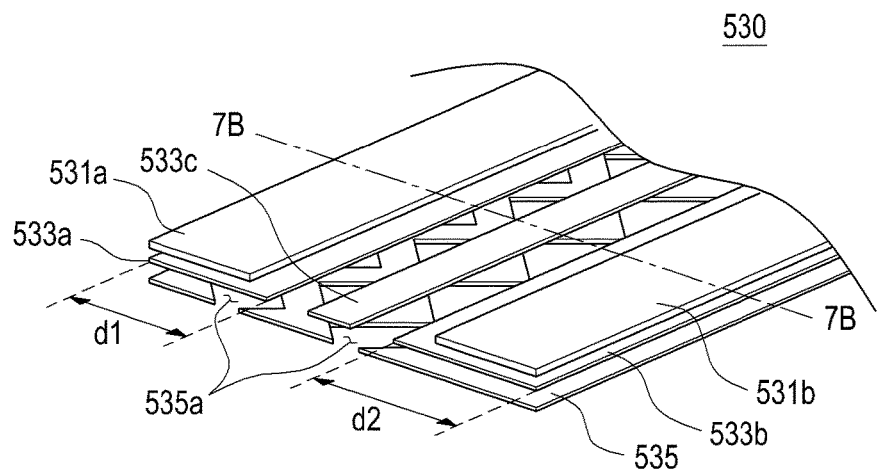
FIG. 7A is a perspective view illustrating a flexible circuit board of a rigid-flex circuit board according to an embodiment.
Figure 7B:
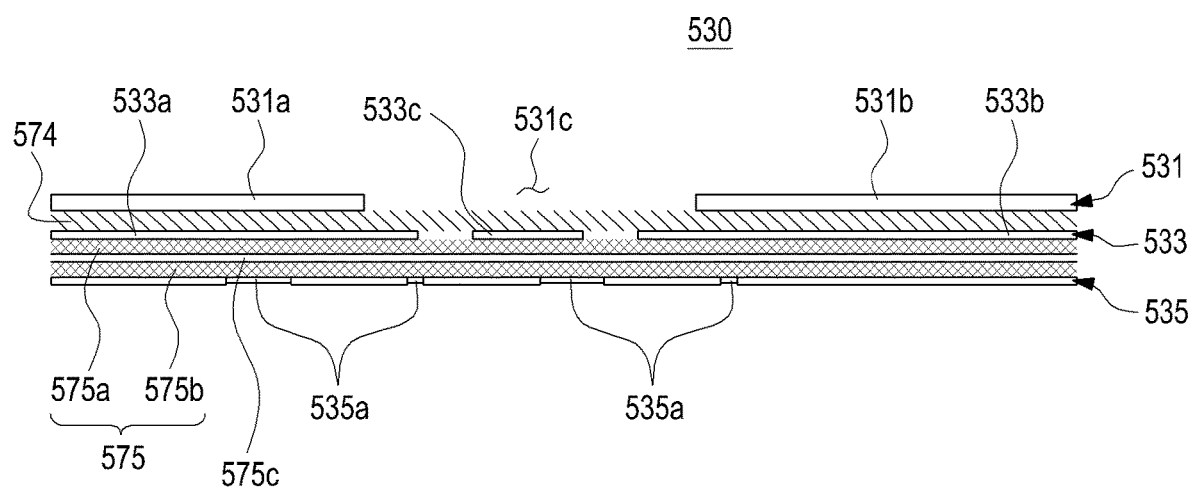
FIG. 7B is a cross-sectional view of the flexible circuit board of FIG. 7A taken along line 7B.

FIG. 7A is a perspective view of the flexible circuit board 500 of a rigid-flex circuit board 500 according to an embodiment. FIG. 7B is a cross-sectional view of the flexible circuit board 530 of FIG. 7A taken along line 7B.

Referring to FIGS. 7A and 7B, the rigid-flex circuit board 500 may include a flexible circuit board 530 and rigid circuit boards 510 and 520 extending from both sides of the flexible circuit board 530, with the flexible circuit board 530 disposed therebetween. The structure of the flexible circuit board 530 of FIG. 7A and FIG. 7B may be the same in whole or in part as the structure of the flexible circuit board 530 of FIG. 5A and FIG. 5B.

Across-correlation, the flexible circuit board 530 of the rigid-flex circuit board 500 may include a fifth conductive layer 531, a sixth conductive layer 533, or a seventh conductive layer 535, and insulating layers disposed between the fifth conductive layer 531, the sixth conductive layer 533, and the seventh conductive layer 535. For example, the flexible circuit board 530 may include a fourth insulating layer 574 disposed to be in contact between the fifth conductive layer 531 and the sixth conductive layer 533 and a fifth insulating layer 575 disposed to be in contact between the sixth conductive layer 533 and the seventh conductive layer 535. The fifth insulating layer 575 may include, e.g., a fifth-first insulating layer 575a and a fifth-second insulating layer 575b that may be separated from each other by an air gap 575c.

The flexible circuit board 530 may have the fifth conductive layer 531, the sixth conductive layer 533, and the seventh conductive layer 535 stacked over one another which have different thicknesses and structures. However, the number of the conductive layers of the flexible circuit board 530 is not limited thereto, and the flexible circuit board 530 may have three or more layers.

The fifth conductive layer 531 of the flexible circuit board 530 may include a third disconnected part 531c that at least partially overlaps a second signal line 533c disposed on the sixth conductive layer 533 as viewed from above the flexible circuit board 530, providing a ground plane. The third disconnected part 531c of the fifth conductive layer 531 may extend up to the rigid circuit boards 510 and 520 in a cut shape along the lengthwise direction of the fifth conductive layer 531.

The fifth conductive layer 531 may include a fourth-first region 531a and a fourth-second region 531b arranged in lines parallel with each other with the third disconnected part 531c disposed therebetween and may extend from the first-first region 511a and the first-second region 511b of the first rigid circuit board 510. The fifth conductive layer 531 may be excluded depending on the structure of the rigid-flex circuit board 500.

The sixth conductive layer 533 of the flexible circuit board 530 may include the second signal line 533c (e.g., the first conductive strip) disposed along the center line and ground lines 533a and 533b (e.g., the second and third conductive strips) disposed on both sides of the second signal line 533c. The second signal line 533c may be, e.g., an RF signal line. The second signal line 533c may extend from the first rigid circuit board 510 up to the second rigid circuit board 520.

The ground lines 533a and 533b may be spaced apart from each other and may include a second-first ground line 533a and a second-second ground line 533b. The second-first ground line 533a and the second-second ground line 533b may extend along the lengthwise direction and with different widths from the fourth-first region 531a and the fourth-second region 531b of the fifth conductive layer 531. For example, the width d1 of the second-first ground line 533a may be larger than the width of the fourth-first region 531a. For example, the width d2 of the second-second ground line 533b may be larger than the width of the fourth-second region 531b.

The second-first ground line 533a and the second-second ground line 533b may be spaced apart from the second signal line 533c. For example, the interval between the second-first ground line 533a and the second signal line 533c and/or the interval between the second-second ground line 533b and the second signal line 533c may range from 0.05 mm to 0.12 mm. For example, the interval between the second-first ground line 533a and the second signal line 533c and/or the interval between the second-second ground line 533b and the second signal line 533c may be about 0.1 mm.

The structure of the sixth conductive layer 533, e.g., the structure of the ground lines 533a and 533b spaced apart on both sides of the second signal line 533c, may provide a line path of a coplanar waveguide (CPW) type. For example, an RF signal line (e.g., the second signal line 533c) and ground lines (e.g., the second-first ground line 533a and the second-second ground line 533b) for the RF signal line formed in the same layer (e.g., the sixth conductive layer 533) may be formed in the CPW type.

The seventh conductive layer 535 of the flexible circuit board 530 may be formed in a single plate shape, providing a ground plane. For example, the seventh ground line 535 may include a ground plane to maintain an electric field through the same plane structure of the ground lines 533a and 533b and the second signal line 533c according to the sixth conductive layer 533. For example, the structure (e.g., a CPW type) of the sixth conductive layer 533 may require the seventh conductive layer 535 to cut off an EM coupling with other signal lines or where it, along with a metallic plate, is fastened to the electronic device 101.

The seventh conductive layer 535 may be formed in a single flat plate shape or in a plate shape including a fourth disconnected part 535a. For example, there may be a plurality of fourth disconnected parts 535a. For example, the seventh conductive layer 535 may provide a mesh-grid type of ground. The mesh-grid type may control ground impedance depending on the arrangement and structure of the fourth disconnected parts 535a, allowing for an increase in the RF line width and a decrease in loss.

Figure 8:
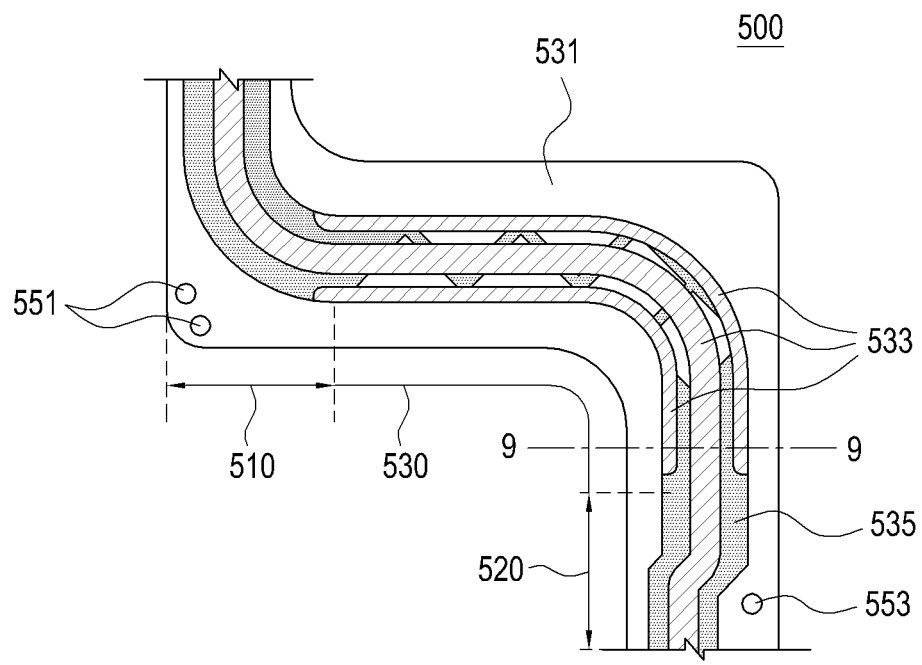
FIG. 8 is a plan view illustrating a portion of a rigid-flex circuit board configured with a curved surface according to an embodiment.
Figure 9:
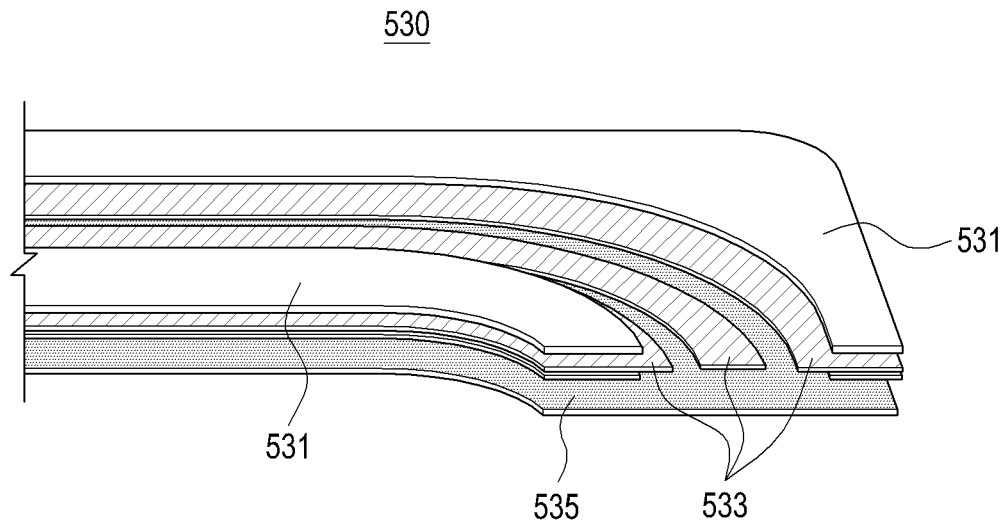
FIG. 9 is a perspective view illustrating the portion of a rigid-flex circuit board of FIG. 8 taken along line 9.

FIG. 8 is a plan view of a portion of the rigid-flex circuit board 500 configured with a curved surface according to an embodiment. FIG. 9 is a perspective view illustrating a cross section of a portion of a rigid-flex circuit board 500 taken along line 9 of FIG. 8.

Referring to FIGS. 8 and 9, the rigid-flex circuit board 500 may include a flexible circuit board 530 and rigid circuit boards 510 and 520 extending from both sides of the flexible circuit board 530, with the flexible circuit board 530 disposed therebetween.

The first rigid circuit board 510 and the second rigid circuit board 520 may include a plurality of conductive layers (e.g., the first conductive layer 511, the second conductive layer 513, the third conductive layer 515, or the fourth conductive layer 517) and a plurality of insulating layers (e.g., the first insulating layer 571, the second insulating layer 572, or the third insulating layer 573 of FIG. 5B) disposed between the plurality of conductive layers. The first rigid circuit board 510 may include at least one first conductive via 551 in a region adjacent to the flexible circuit board 530. For example, the second rigid circuit board 520 may include at least one second conductive via 553 in a region adjacent to the flexible circuit board 530.

The flexible circuit board 530 may include a plurality of conductive layers (e.g., the fifth conductive layer 531, the sixth conductive layer 533, or the seventh conductive layer 535) and insulating layers (e.g., the fourth insulating layer 574 or the fifth insulating layer 575) disposed between the plurality of conductive layers.

FIGS. 8 and 9 illustrate the rigid-flex circuit board 500 mounted in a curved shape inside the electronic device. The description of the configuration of the rigid-flex circuit board 500 of FIG. 5A to FIG. 7B may apply to the configuration of the rigid-flex circuit board 500 of FIGS. 8 and 9.

Figure 10A:
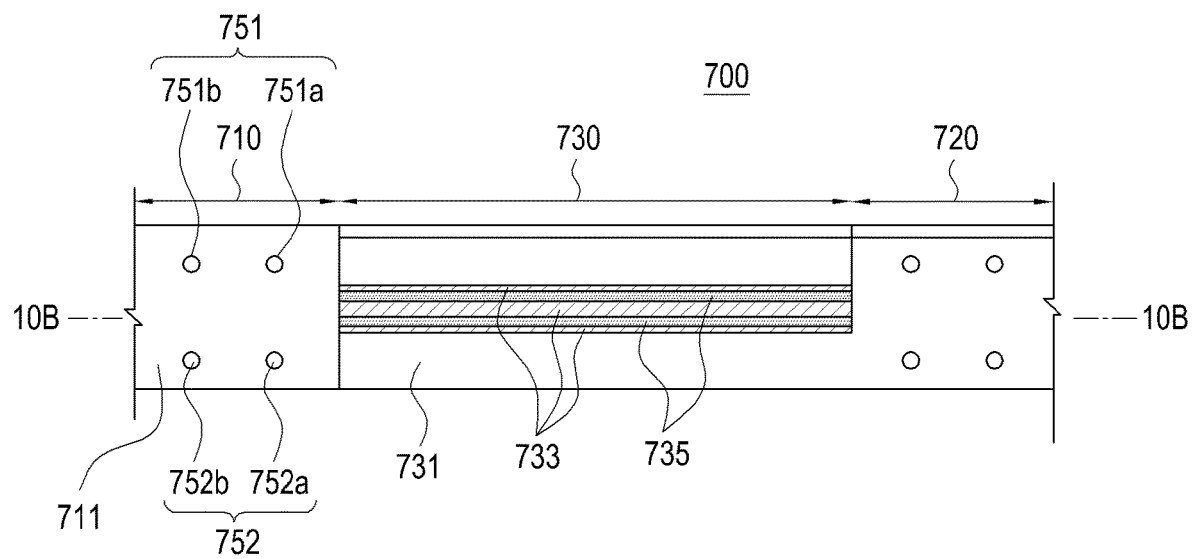
FIG. 10A is a plan view illustrating a portion of a rigid-flex circuit board according to another embodiment.
Figure 10B:
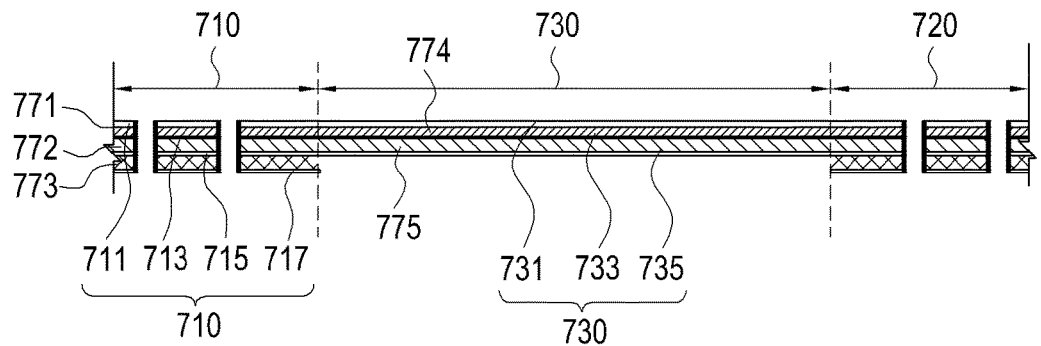
FIG. 10B is a cross-sectional view of the rigid-flex circuit board of FIG. 10A taken along line 10B.

FIG. 10A is a plan view of a portion of a rigid-flex circuit board 700 according to another embodiment. FIG. 10B is a cross-sectional view of the rigid-flex circuit board 700 taken along line 10B of FIG. 10A.

Referring to FIGS. 10A and 10B, the rigid-flex circuit board 700 may include a flexible circuit board 730 and rigid circuit boards 710 and 720 extending from both sides of the flexible circuit board 730, with the flexible circuit board 730 disposed therebetween. The structure of the rigid-flex circuit board 700 of FIGS. 10A and 10B may be the same in whole or in part as the structure of the circuit board 340 of FIG. 4. Insulating layers are excluded from where conductive vias are disposed so that the conductive vias are shown even though the insulating layers are not supposed to be excluded in practice.

Unlike the rigid-flex circuit board 500 of FIGS. 5A and 5B, the rigid-flex circuit board 700 of FIGS. 10A and 10B may have the uppermost conductive layers (e.g., the first conductive layer 711 and the fifth conductive layer 731) disconnected in at least a region (e.g., the fifth conductive layer 731) of the flexible circuit board 730 or overall with no disconnected part. Thus, the rigid circuit boards 710 and 720 may provide a strip type of signal line path.

The rigid-flex circuit board 700 may have a multi-layered structure with the rigid circuit boards 710 and 720 which form a first region and a third region of the rigid-flex circuit board 700 and the flexible circuit board 730 which forms a second region of the rigid-flex circuit board 700. For example, the rigid circuit boards may include a first rigid circuit board 710 and a second rigid circuit board 720, with the flexible circuit board 730 disposed therebetween. The first rigid circuit board 710 and the second rigid circuit board 720 may form substantially the same layer and the same structure. Hereinafter, the first rigid circuit board 710 is described, and the description of the first rigid circuit board 710 may apply to the second rigid circuit board 720. However, embodiments of the present disclosure are not limited to the structure. For example, the rigid-flex circuit board 700 may be formed with various layouts and layers, such as a rigid circuit board being disposed between a plurality of flexible circuit boards. For example, the rigid-flex circuit board 700 may be produced in an 8-6-8 structure (of eight rigid circuit boards and six flexible circuit boards) or an 8-5-8 structure (of eight rigid circuit boards and five flexible circuit boards).

In a cross-sectional view of the rigid-flex circuit board 700 taken along the lengthwise direction 10B, the rigid-flex circuit board 700 may have a plurality of layers stacked over one another. For example, the rigid-flex circuit board 700 may include a plurality of conductive layers and insulating layers disposed between the plurality of conductive layers.

The first rigid circuit board 710 and the flexible circuit board 730 may be formed in different layers. For example, the first rigid circuit board 710 may include a first conductive layer 711, a second conductive layer 713, a third conductive layer 715, or a fourth conductive layer 717 and may be formed with a layer including at least one signal line (e.g., the second conductive layer 713) and a layer (e.g., the first conductive layer 711, the third conductive layer 715, or the fourth conductive layer 717) including at least one ground. A partial structure (e.g., the first signal line 713c of FIG. 11A) of the second conductive layer 713 and the ground structure of the first conductive layer 711 and the fourth conductive layer 717 spaced apart from the top and bottom of the partial structure of the second conductive layer 713 may provide a strip type of line path. For example, the flexible circuit board 730 may include, at least, a fifth conductive layer 731, a sixth conductive layer 733, or a seventh conductive layer 735 and be formed with a layer including at least one signal line (e.g., the sixth conductive layer 733) and a layer including at least one ground (e.g., the fifth conductive layer 731 or the seventh conductive layer 735).

The first rigid circuit board 710 may include a first insulating layer 771 disposed to be in contact between the first conductive layer 711 and the second conductive layer 713, a second insulating layer 772 disposed to be in contact between the second conductive layer 713 and the third conductive layer 715, and a third insulating layer 773 disposed to be in contact between the third conductive layer 715 and the fourth conductive layer 717. As another example, the flexible circuit board 730 may include a fourth insulating layer 774 disposed to be in contact between the fifth conductive layer 731 and the sixth conductive layer 733 and a fifth insulating layer 775 disposed to be in contact between the sixth conductive layer 733 and the seventh conductive layer 735.

The first rigid circuit board 710 may include a plurality of conductive vias 751 and 752. For example, a region of the first rigid circuit board 710 may include a via hole for at least one first conductive via 751. The first conductive vias 751 may include a first-first conductive via 751a and a first-second conductive via 751b each of which may pass through from the first conductive layer 711 to the fourth conductive layer 717, conducting current. For example, another region of the first rigid circuit board 710 may include a via hole for at least one second conductive via 752. The second conductive via 752 may include a second-first conductive via 752a and a second-second conductive via 752b each of which may pass through from the first conductive layer 711 to the fourth conductive layer 717, conducting electric current.

Figure 11A:
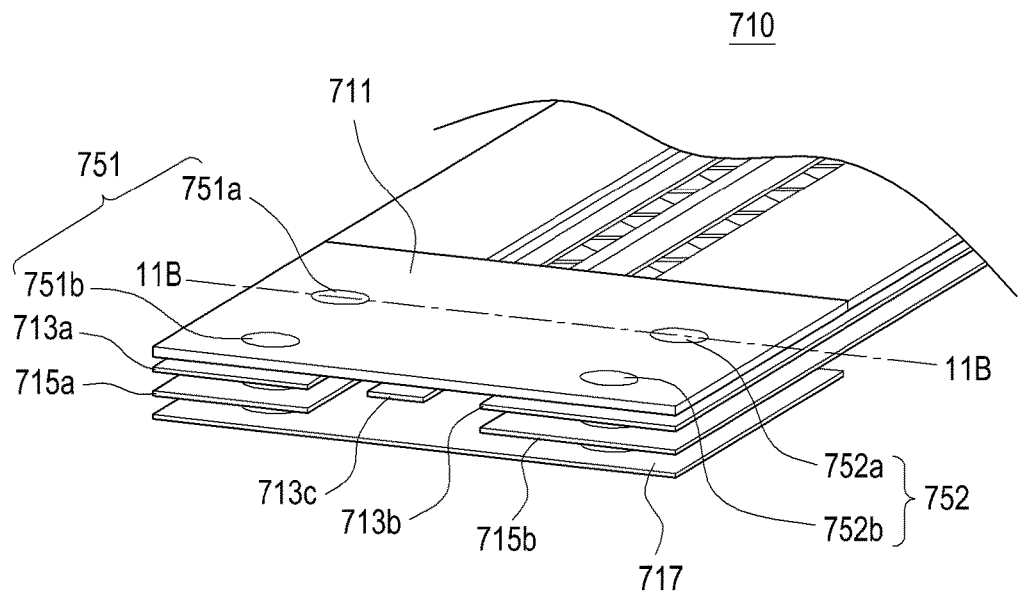
FIG. 11A is a perspective view illustrating a first rigid circuit board of a rigid-flex circuit board according to an embodiment.
Figure 11B:
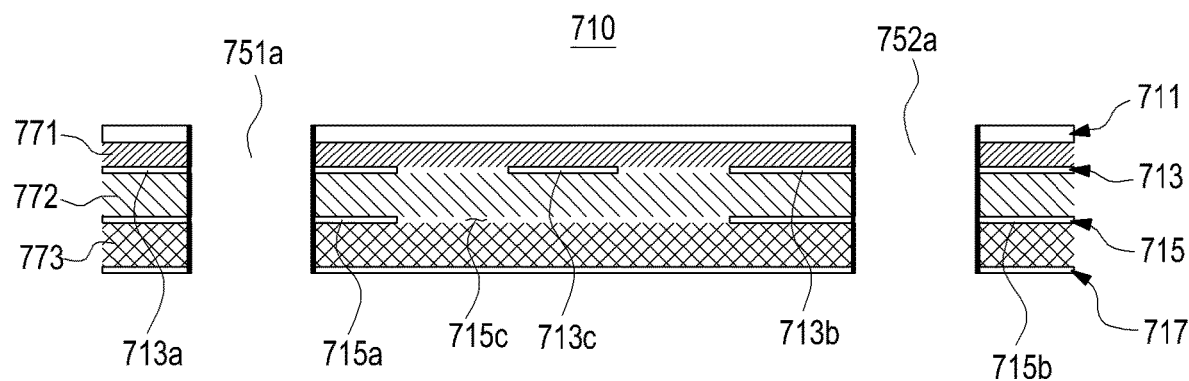
FIG. 11B is a cross-sectional view of the first rigid circuit board of FIG. 11A taken along line 11B.

FIG. 11A is a perspective view of the first rigid circuit board 710 of a rigid-flex circuit board according to an embodiment. FIG. 11B is a cross-sectional view of the first rigid circuit board 710 of FIG. 11A taken along line 11B.

Referring to FIGS. 11A and 11B, the rigid-flex circuit board may include a flexible circuit board and rigid circuit boards extending from both sides of the flexible circuit board 730, with the flexible circuit board 730 disposed therebetween. The structure of the first rigid circuit board 710 and the flexible circuit board 730 of FIG. 11A and FIG. 11B may be the same in whole or in part as the structure of the rigid circuit boards 710 and 720 and the flexible circuit board 730 of FIG. 10A and FIG. 10B.

The first rigid circuit board 710 of the rigid-flex circuit board may include a first conductive layer 711, a second conductive layer 713, a third conductive layer 715, or a fourth conductive layer 717 and insulating layers disposed therebetween. For example, the first rigid circuit board 710 may include the first insulating layer 771 disposed to be in contact between the first conductive layer 711 and the second conductive layer 713, the second insulating layer 772 disposed to be in contact between the second conductive layer 713 and the third conductive layer 715, and the third insulating layer 773 disposed to be in contact between the third conductive layer 715 and the fourth conductive layer 717.

The first rigid circuit board 710 may have the first conductive layer 711, the second conductive layer 713, the third conductive layer 715, and the fourth conductive layer 717 stacked on one another which have different thicknesses and structures. However, the number of the conductive layers of the first rigid circuit board 710 is not limited thereto, and the first rigid circuit board 710 may have four or more layers.

The first conductive layer 711 of the first rigid circuit board 710 may be formed in a single flat layer, providing a ground plane. The first conductive layer 711 may support the first rigid circuit board 710 and, along with the first signal line 713c and the fourth conductive layer 717 of the second conductive layer 713, provide a strip type of line path. The first conductive layer 711 may extend up to the flexible circuit board 730.

The first conductive layer 711 may include via holes for the first conductive vias 751 or the second conductive vias 752 on both sides of the center line in the lengthwise direction. For example, via holes for the first conductive vias 751 may be provided on one side of the first conductive layer 711, and via holes for the second conductive vias 752 may be provided on the other side of the first conductive layer 711. The first conductive vias 751 may include a first-first conductive via 751a and a first-second conductive via 751b each of which may pass through from the first conductive layer 711 to the fourth conductive layer 717, conducting current. The second conductive via 752 may include a second-first conductive via 752a and a second-second conductive via 752b each of which may pass through from the first conductive layer 711 to the fourth conductive layer 717, conducting electric current. The first conductive vias 751 or the second conductive vias 752 are not limited to being arranged on both sides but may instead be arranged in various positions for efficient current conducting for the first rigid circuit board 710 and the flexible circuit board 730.

The second conductive layer 713 of the first rigid circuit board 710 may include a first signal line 713c and a first-first region 713a and a first-second region 713b disposed on both sides of the first signal line 713c. The first signal line 713c may be, e.g., an RF signal line and extend from the first rigid circuit board 710 through the flexible circuit board 730 up to the other rigid circuit board 720.

At least part of the first-first region 713a and the first-second region 713b may provide a ground for the first signal line 713c. For example, regions of the first-first region 713a and the first-second region 713b which are positioned adjacent to the flexible circuit board 730 may be a ground of the RF signal line.

The first-first region 713a and the first-second region 713b may be spaced apart from the first signal line 713c. For example, the interval between the first-first region 713a and the first signal line 713c and/or the interval between the first-second region 713b and the first signal line 713c may range from 0.05 mm to 0.12 mm. For example, the interval between the first-first region 713a and the first signal line 713c and/or the interval between the first-second region 713b and the first signal line 713c may be about 0.1 mm.

The first-first region 713a and the first-second region 713b may connect through the first conductive via 751 or the second conductive via 752 from the second conductive layer 713 to the first conductive layer 711, passing through and conducting current down to the fourth conductive layer 717.

The third conductive layer 715 of the first rigid circuit board 710 may include a first disconnected part 715c, a second-first region 715a, and a second-second region 715b. The second-first region 715a may face the first-first region 713a, and the second-second region 715b may face the first-second region 713b.

The first disconnected part 715c of the third conductive layer 715 may extend up to the flexible circuit board in a cut shape along the lengthwise direction. The second-first region 715a and the second-second region 715b may extend up to the ground line (e.g., the seventh conductive layer 735 of FIG. 12A) of the flexible circuit board 730, stably supporting the ground line.

The second-first region 715a and the second-second region 715b may connect through the first conductive via 751 or the second conductive via 752 from the first conductive layer 711 to the first-first region 713a or the first-second region 713b of the second conductive layer 713, passing through and conducting current to the fourth conductive layer 717.

The second conductive layer 713 or the third conductive layer 715 may be disposed between the fourth conductive layer 717 and the first conductive layer 711 of the first rigid circuit board 710. The fourth conductive layer 717 may substantially support, e.g., the first rigid circuit board 710. The fourth conductive layer 717 may provide a ground plane for the first signal line 713c of the second conductive layer 713.

The structure of the fourth conductive layer 717, e.g., the ground structure of the first layer and the first signal line 713c of the second layer, may provide a line path of a strip type. The fourth conductive layer 717 may include a via hole for the first conductive via 751 or the second conductive via 752. For example, the fourth conductive layer 717 may be electrically connected with the first conductive layer 711 through the first conductive via 751 or the second conductive via 752, conducting current.

Figure 13A:
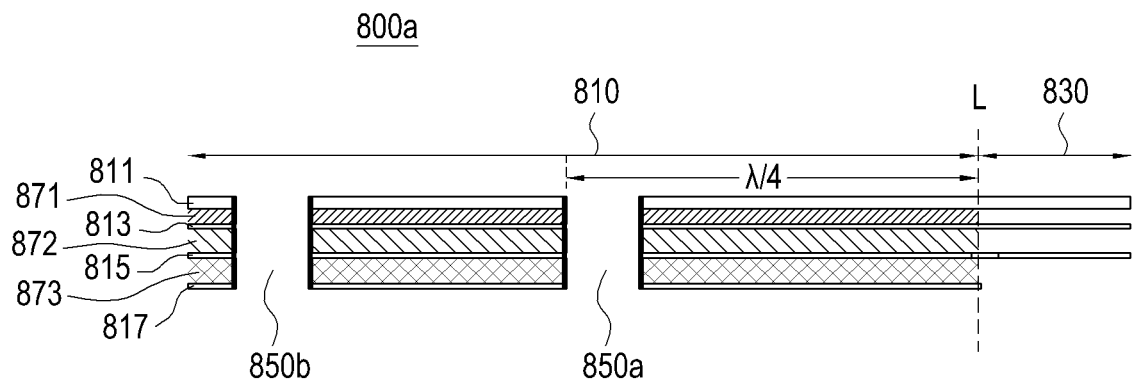
FIG. 13A is a cross-sectional view illustrating a portion of a rigid-flex circuit board indicating a position of a conductive via according to an embodiment.
Figure 13B:
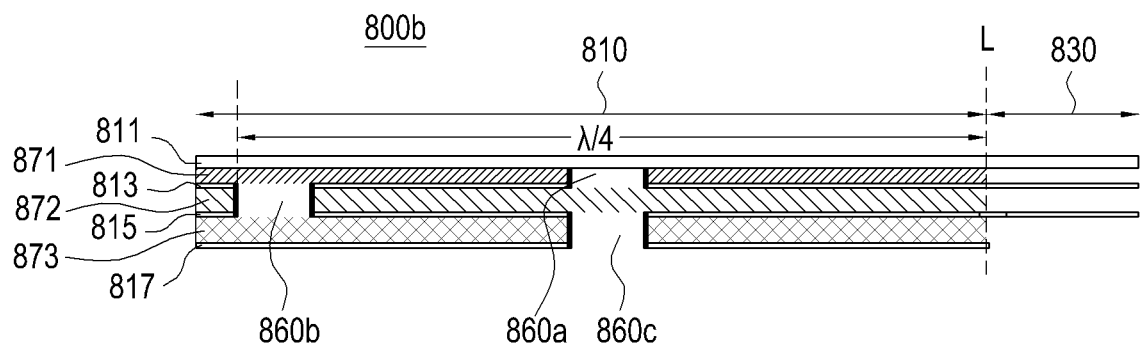
FIG. 13B is a cross-sectional view illustrating a portion of a rigid-flex circuit board indicating a position of a conductive via different from that of FIG. 13A according to an embodiment.

However, the configuration of the first conductive via 751 or the second conductive via 752 is not limited to passing through all of the layers but may instead be disposed in a different position of each conductive layer (e.g., not to face each other) to electrically connect the conductive layers of the first rigid circuit board 710 (refer to FIG. 13B). For example, the first conductive via 751 or the second conductive via 752 may be disposed within a ¼ wavelength (¼λ) from the border surface of the rigid circuit boards 710 and 720 and the flexible circuit board 730.

Figure 12A:
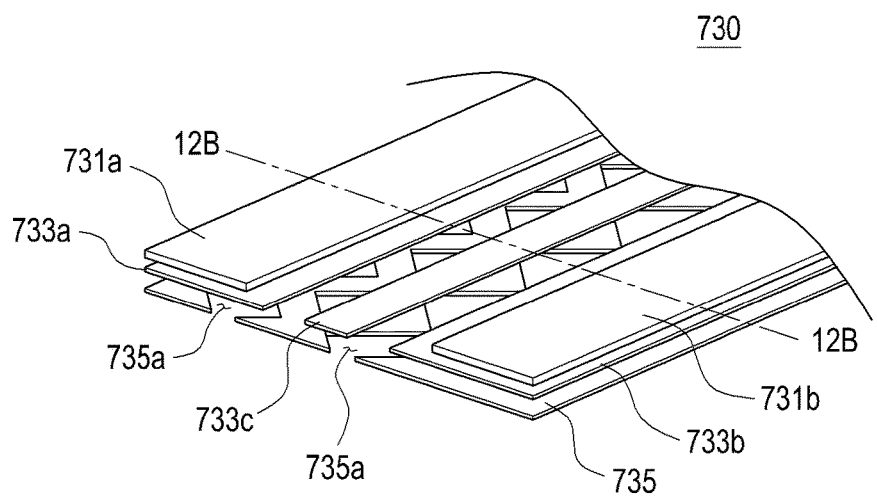
FIG. 12A is a perspective view illustrating a flexible circuit board of a rigid-flex circuit board according to an embodiment.
Figure 12B:
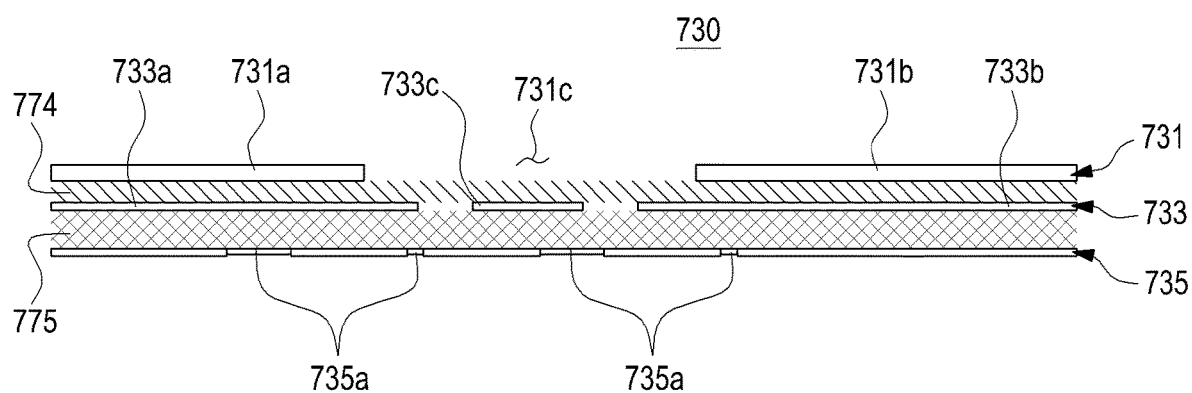
FIG. 12B is a cross-sectional view of the flexible circuit board of FIG. 12A taken along line 12B.

FIG. 12A is a perspective view of a flexible circuit board 730 of a rigid-flex circuit board according to an embodiment. FIG. 12B is a cross-sectional view of the flexible circuit board 730 of FIG. 12A taken along line 12B.

Referring to FIGS. 12A and 12B, the rigid-flex circuit board 700 may include a flexible circuit board 730 and rigid circuit board 710 extending from both sides of the flexible circuit board 730, with the flexible circuit board 730 disposed therebetween. The structure of the flexible circuit board 730 of FIG. 12A and FIG. 12B may be the same in whole or in part as the structure of the flexible circuit board 730 of FIG. 10A and FIG. 10B.

Across-correlation, the flexible circuit board 730 of the rigid-flex circuit board 700 may include a fifth conductive layer 731, a sixth conductive layer 733, or a seventh conductive layer 735, and insulating layers disposed between the fifth conductive layer 731, the sixth conductive layer 733, and the seventh conductive layer 735. For example, the flexible circuit board 730 may include a fourth insulating layer 774 disposed to be in contact between the fifth conductive layer 731 and the sixth conductive layer 733 and a fifth insulating layer 775 disposed to be in contact between the sixth conductive layer 733 and the seventh conductive layer 735.

The flexible circuit board 730 may have the fifth conductive layer 731, the sixth conductive layer 733, and the seventh conductive layer 735 stacked over one another which have different thicknesses and structures. However, the number of the conductive layers of the flexible circuit board 730 is not limited thereto, and the flexible circuit board 730 may have three or more layers.

The fifth conductive layer 731 of the flexible circuit board 730 may include a second disconnected part 731c that at least partially overlaps a second signal line 733c disposed on the sixth conductive layer 733 as viewed from above the flexible circuit board 730, providing a ground plane.

The description of the structure of the fourth-first region 731a, the fourth-second region 731b, and the third disconnected part 531c of the fifth conductive layer 531 as shown in FIGS. 7A and 7B may apply to the structure of the third-first region 731a, the third-second region 731b, and the second disconnected part 731c of the fifth conductive layer 731.

The sixth conductive layer 733 of the flexible circuit board 730 may include the second signal line 733c disposed along the center line and a second-first ground line 733a and a second-second ground line 733b disposed on both sides of the second signal line 733c. The second signal line 733c may be, e.g., an RF signal line and, as viewed from above the flexible circuit board 730, at least partially overlap the second disconnected part 731c of the fifth conductive layer 731.

The description of the structure of the second-first ground line 733a, the second-second ground line 733b, and the second signal line 733c of the sixth conductive layer 733 as shown in FIGS. 7A and 7B may apply to the structure of the second-first ground line 733a, the second-second ground line 733b, and the second signal line 733c of the sixth conductive layer 733.

The seventh conductive layer 735 of the first rigid circuit board 710 may be formed in a single plate shape, providing a ground plane.

The description of the structure of the seventh conductive layer 535 and at least one fourth disconnected part 535a as shown in FIGS. 7A and 7B may apply to the structure of the seventh conductive layer 735 and at least one third disconnected part 735a.

FIG. 13A is a cross-sectional view illustrating a portion of a rigid-flex circuit board 800a indicating the position of a conductive via according to an embodiment. FIG. 13B is a cross-sectional view illustrating a portion of a rigid-flex circuit board 800b indicating the position of a conductive via different from that of FIG. 13A according to an embodiment.

Referring to FIGS. 13A and 13B, the rigid-flex circuit boards may include a flexible circuit board 830 and rigid circuit boards 810 extending from both sides of the flexible circuit board 830, with the flexible circuit board 830 disposed therebetween. The structure of the rigid-flex circuit board 800a of FIG. 13A and the rigid-flex circuit board 800b of FIG. 13B may be the same in whole or in part as the structure of the rigid-flex circuit boards 500, 600, and 700 of FIGS. 5A to 12B.

In a cross-sectional view of the rigid-flex circuit boards 800a and 800b taken along the lengthwise direction, the rigid-flex circuit boards 800a and 800b may have a plurality of layers stacked over one another. For example, the rigid-flex circuit boards 800a and 800b may include a plurality of conductive layers and insulating layers disposed between the plurality of conductive layers. For example, referring to FIGS. 13A and 13B, the rigid circuit board 810 may include a first conductive layer 811, a second conductive layer 813, a third conductive layer 815, or a fourth conductive layer 817 and may include a first insulating layer 871 disposed to be in contact between the first conductive layer 811 and the second conductive layer 813, a second insulating layer 872 disposed to be in contact between the second conductive layer 813 and the third conductive layer 815, and a third insulating layer 873 disposed to be in contact between the third conductive layer 815 and the fourth conductive layer 817. Insulating layers are excluded from where conductive vias are disposed so that the conductive vias are shown even though the insulating layers are not supposed to be excluded in practice.

In the rigid-flex circuit board, the rigid circuit board 810a may have a first conductive via 850a or a second conductive via 850b. According to an embodiment, the first conductive via 850a or the second conductive via 850b may be disposed within ¼λ from the border line L between the rigid circuit board 810 and the flexible circuit board 830.

The first conductive via 850a or the second conductive via 850b may be provided as a hole that passes straight through from the first conductive layer 811 to the fourth conductive layer 817. The centers of the via holes formed in the layers may be aligned with the same line.

In the rigid-flex circuit board 810, the rigid circuit board 810 may have a third conductive via 860a, a fourth conductive via 860b, or a fifth conductive via 860c. The third conductive via 860a, the fourth conductive via 860b, or the fifth conductive via 860c may be disposed within ¼λ from the border line L between the rigid circuit board 810 and the flexible circuit board 830.

The third conductive via 860a may electrically connect the first conductive layer 811 and the second conductive layer 813. The fourth conductive via 860b may electrically connect the second conductive layer 813 and the third conductive layer 815. The fifth conductive via 860c may electrically connect the third conductive layer 815 and the fourth conductive layer 817. As viewed from above the rigid-flex circuit board 800, the third conductive via 860a and the fifth conductive via 860c may at least partially overlap each other. For example, the distance between the third conductive via 860a and the fifth conductive via 860c and the flexible circuit board 830 may be less than the distance between the fourth conductive via 860b and the flexible circuit board 830. For example, the fourth conductive via 860b may be disposed within ¼λ from the border line L.

Figure 14:
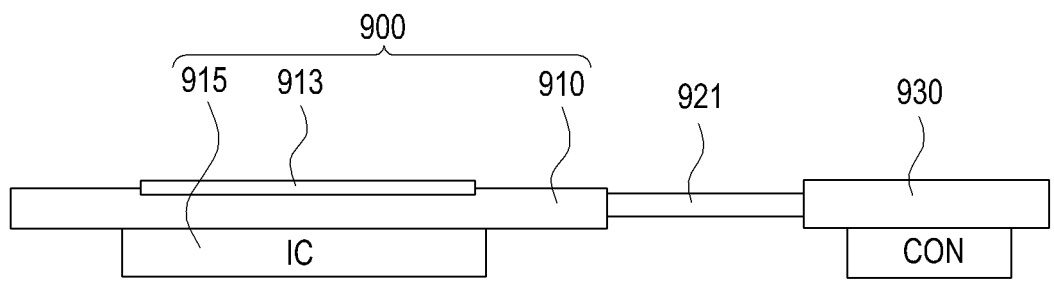
FIG. 14 is an illustration of a flexible circuit board electrically connecting a main circuit board with a circuit board where a communication device is disposed in an electronic device according to an embodiment.

FIG. 14 is a cross-sectional view schematically illustrating a flexible circuit board electrically connecting a main circuit board with a communication device in an electronic device according to an embodiment.

Referring to FIG. 14, a configuration is illustrated regarding transmission of communication signals between a first rigid circuit board 910 included in a communication device 900 of the electronic device 101 and a second rigid circuit board 930 where a processor 120 or an RF transceiver (e.g., the wireless communication module 192 of FIG. 1) is disposed. The communication device may be a mmWave communication device to perform wireless communication in a frequency band of, e.g., 6 GHz or more and 300 GHz or less.

The electronic device may include a processor 120, a power management module 188 (e.g., a PMIC), or an RF transceiver mounted on the second rigid circuit board 930 (e.g., a main circuit board). The communication device 900 may include the first rigid circuit board 910 disposed adjacent to the second rigid circuit board 930.

The communication device 900 may include the wireless communication circuit 915 and an antenna 913 mounted on the first rigid circuit board 910. For example, a plurality of antennas 913 may be provided, forming an antenna array. For example, the communication device 900 may be structured such that the wireless communication circuit 915 and the antenna 913 are disposed on the first rigid circuit board 910. The wireless communication circuit 915 may receive communication signals through the RF transceiver or transmit received communication signals to the RF transceiver. For example, the wireless communication circuit 915 may be controlled by the processor 120 to conduct wireless communication using the antenna 913. The wireless communication circuit 915 may receive control signals and power from the power management module 188 and the processor 120 to process communication signals received from the outside or communication signals to be sent to the outside. For example, the wireless communication circuit 915 may include a switch circuit to split transmit and receive signals or various amplifiers or filters to raise the quality of transmit or receive signals.

When a plurality of antennas 913 form an antenna array, the wireless communication circuit 915 may include a phase shifter connected to each radiating conductor to control the directivity of communication signals. For example, when the communication device 900 includes an antenna array, the wireless communication circuit 915 may provide phase difference power to the antennas 913 included in the antenna array, controlling the directivity of the communication device or the electronic device 101 including the communication device. The phase difference power may be useful in securing an optimal or good communication environment in high-directivity communication schemes, such as mmWave communication (e.g., wireless communication adopting a frequency band of 6 GHz or more and 300 GHz or less).

The first rigid circuit board 910 may connect to the second rigid circuit board 930 through the first flexible circuit board 921. For example, the first flexible circuit board 921 may deliver control signals, power, or communication signals from the second rigid circuit board 930 to the first rigid circuit board 910. Signals received through the communication device may be transferred through the first flexible circuit board 921 to the second rigid circuit board 930. The mmWave communication band through the RF line path disposed on the first flexible circuit board 921 may range from 9 GHz to 11 GHz.

The rigid-flex circuit board (e.g., the first rigid circuit board 910, the first flexible circuit board 921, and the second rigid circuit board 930) may be formed in a multi-layered structure with a layer including at least one signal line and a layer including at least one ground. The description of the structure of the rigid-flex circuit boards 500, 600, and 700 as shown in FIGS. 5A to 12B may apply to the structure of the rigid-flex circuit board.

For example, a certain layer of the first flexible circuit board 921 may include a signal line (e.g., the second signal line 533c of FIG. 5A) disposed along the center line and ground lines (e.g., the second-first ground line 533a and the second-second ground line 533b of FIG. 5A) disposed on both sides of the signal line. For example, the structure of the ground lines spaced apart from each other on both sides of the signal line may provide a CPW type of line path. For example, there may further be provided some layers having the structure of grounds spaced apart from the top and bottom of the signal line. The arrangement of the signal line and the grounds may provide a micro-strip type of line path.

Figure 15:
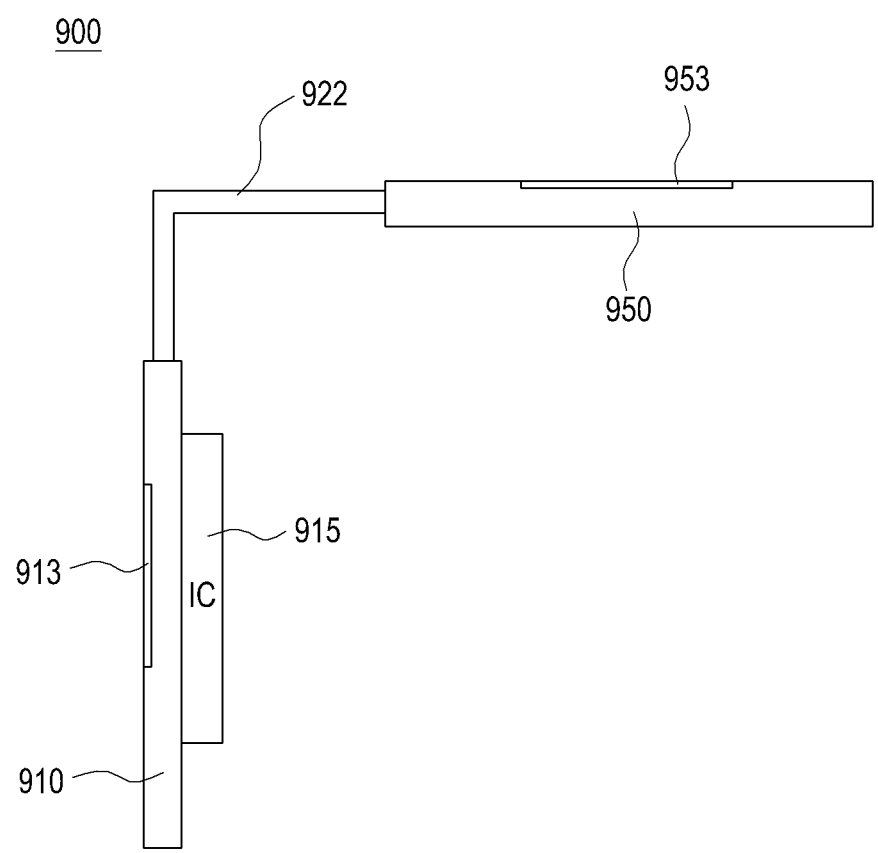
FIG. 15 is an illustration of a flexible circuit board connecting circuit boards where communication devices are disposed in an electronic device according to an embodiment.

FIG. 15 is a cross-sectional view schematically illustrating a flexible circuit board connecting circuit boards where communication devices are disposed in an electronic device according to an embodiment.

Referring to FIG. 15, a configuration is illustrated in which a first rigid circuit board 910 included in a communication device 900 of the electronic device 101 is electrically connected with a second rigid circuit board 950. The communication device 900 may be a mmWave communication device to perform wireless communication in a frequency band of, e.g., 6 GHz or more and 300 GHz or less.

The first rigid circuit board 910 may connect with the second rigid circuit board 950 through the flexible circuit board 922. For example, the flexible circuit board 922 may transfer control signals, power, or communication signals from the first rigid circuit board 910 to the second rigid circuit board 950. The first rigid circuit board 910 may include a wireless communication circuit 915 and a first antenna 913. The second rigid circuit board 950 may include a second antenna 953. The communication device 900 may be structured with the first rigid circuit board 910, the second rigid circuit board 950, the flexible circuit board 922, the wireless communication circuit 915, the first antenna 913, or the second antenna 953. The mmWave communication band through the RF line path disposed on the flexible circuit board 922 may range from 6 GHz to 300 GHz.

A plurality of antennas 913 may be disposed on the first rigid circuit board 910 to form an antenna array, forming a beam pattern in a first direction. According to an embodiment, a plurality of antennas 915 may be disposed on the second rigid circuit board 950 to form an antenna array, forming a beam pattern in a second direction different from the first direction.

The rigid-flex circuit board (e.g., the first rigid circuit board 910, the flexible circuit board 922, and the second rigid circuit board 950) may be formed in a multi-layered structure with a layer including at least one signal line and a layer including at least one ground. The description of the structure of the rigid-flex circuit boards 500, 600, and 700 as shown in FIGS. 5A to 12B may apply to the structure of the rigid-flex circuit board.

For example, a certain layer of the flexible circuit board 922 may include a signal line (e.g., the second signal line 533c of FIG. 7A) disposed along the center line and ground lines (e.g., the second-first ground line 533a and the second-second ground line 533b of FIG. 7A) disposed on both sides of the signal line. For example, the structure of the ground lines spaced apart from each other on both sides of the signal line may provide a CPW type of line path. For example, there may further be provided some layers having the structure of grounds spaced apart from the top and bottom of the signal line. The arrangement of the signal line and the grounds may provide a micro-strip type of line path.

Figures 16A, 16B:
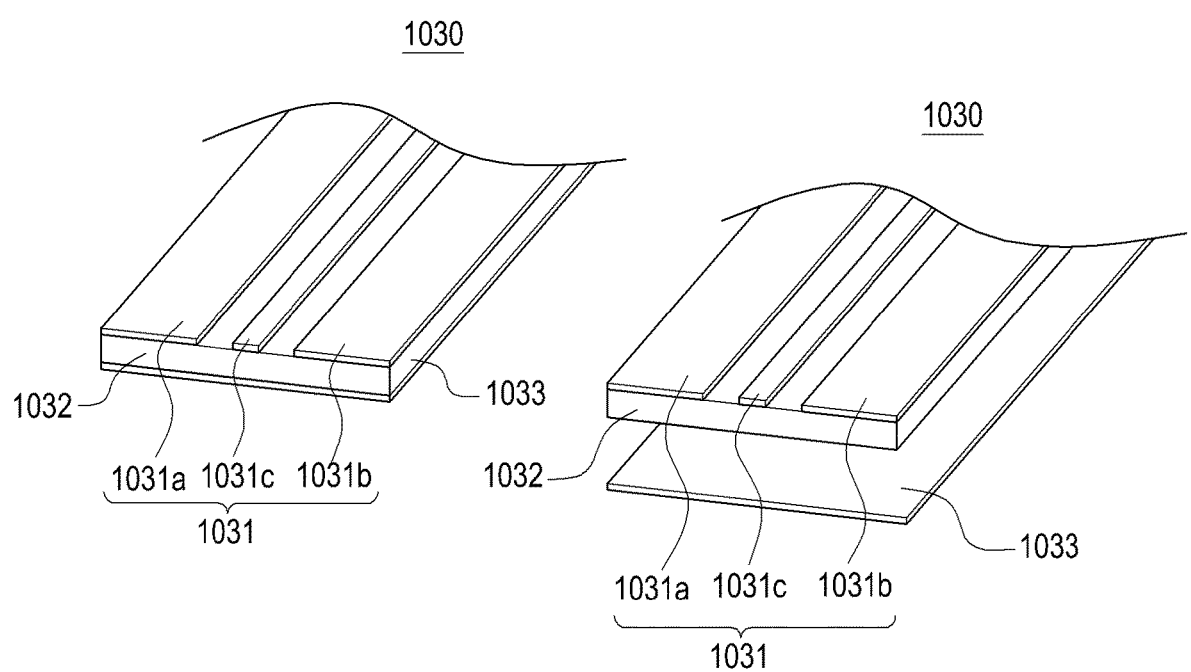
FIG. 16A is a perspective view illustrating the state of a flexible circuit board before and after a rigid-flex circuit board is bent according to an embodiment.
FIG. 16B is a perspective view illustrating the state of a flexible circuit board after a rigid-flex circuit board is bent.

FIGS. 16A and 16B are perspective views of a state of a flexible circuit board 1030 before and after a rigid-flex circuit board is bent according to an embodiment.

Referring to FIGS. 16A and 16B, the same flexible circuit board is illustrated. FIG. 16B illustrates an example in which a ground 1033 is spaced apart from the rest to conduct a test under the assumption that the flexible circuit board of FIG. 16A is in a bent position.

Figure 17:
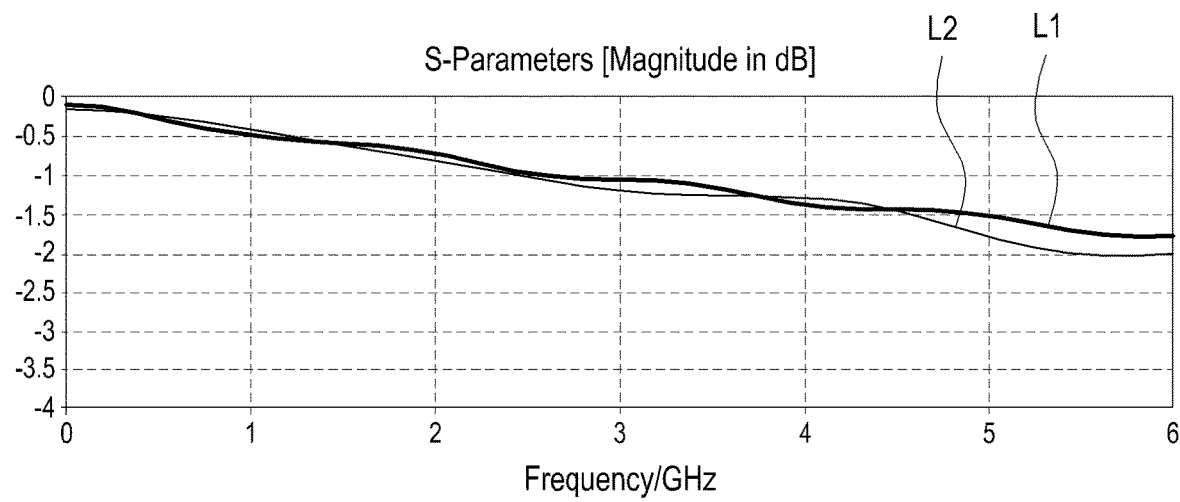
FIG. 17 is a graph of per-frequency band return loss before and after a rigid-flex circuit board is bent according to an embodiment.
Figure 18:
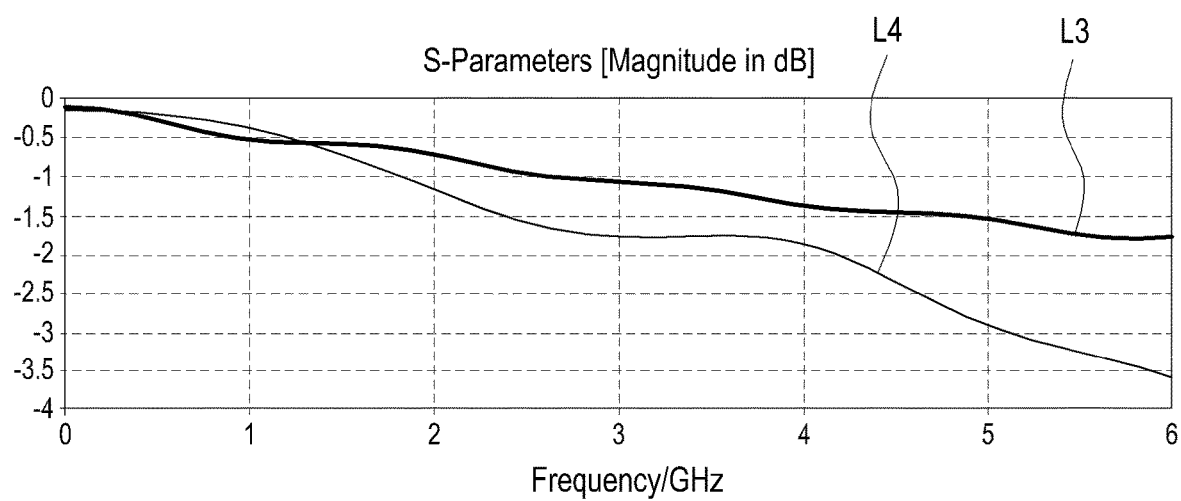
FIG. 18 is a graph of per-frequency band return loss before and after a rigid-flex circuit board is bent according to the related art.

FIG. 17 is a graph illustrating per-frequency band return loss before and after a rigid-flex circuit board is bent according to an embodiment. FIG. 18 is a graph illustrating per-frequency band return loss before and after a rigid-flex circuit board is bent according to the related art.

The structure of the flexible circuit board 1030 of the rigid-flex circuit board as shown in FIGS. 16A, 16B, 17, and 18 may be the same in whole or in part as the structure of the rigid-flex circuit boards 500, 600, and 700 of FIGS. 5A to 12B.

In the flexible circuit board 1030 before bent, the plurality of conductive layers may remain stacked over one another without being spaced apart (see FIG. 16A and, when the flexible circuit board 1030 is bent, some conductive layers may be warped, agape, or deformed. For example, at least some of the conductive layers of the flexible circuit board 1030 may not be adhered to each other and, thus, are bent to be agape.

The flexible circuit board 1030 may include a signal line 1031c, a conductive layer 1031 including ground lines 1031a and 1031b spaced apart from the signal line 1031c, and another conductive layer 1033 forming a ground facing the conductive layer, with at least one insulating layer 1032 disposed therebetween. The flexible circuit board 1030 may be structured such that a CPW type of line path and a micro-strip type of line path are combined.

The structure of the flexible circuit board 1030 may undergo some variation in return loss as per frequency band before and after bent, but it can be seen that there is little or no difference in return loss in a substantial majority of bands.

Referring to FIG. 17, line L1 may indicate a degree of return loss per RF frequency band of the flexible circuit board 1030 when not bent according to the disclosure, and line L2 may indicate a degree of return loss per RF frequency band of the flexible circuit board 1030 when bent according to the disclosure.

The structure of the flexible circuit board 1030 may have a CPW type of line path and a micro-strip type of line path deployed together, providing a substantial even return loss regardless of whether it is bent. The return loss before and after bent shows similar graphs on an overall frequency band (e.g., a frequency band from 0 GHz to 6.0 GHz), and it can be shown that a tiny return loss error arises within a range not more than 0.1 dB between line L1 and line L2.

The structure may stabilize signal integrity and radio frequency interference (RFI) and reduce noise even when it is reversely bent or warped.

In FIG. 18, the conventional structure (which has a flexible circuit board with a micro type arrangement) causes a significantly large return loss difference as some portion of the flexible circuit board is bent. According to an embodiment, line L3 may indicate a degree of return loss per RF frequency band of the flexible circuit board when not bent, and line L4 may indicate a degree of return loss per RF frequency band of the flexible circuit board when bent.

When the flexible circuit board of the conventional structure is bent, the frequency band may increase and, thus, the return loss between line L3 and line L4 may cause an error of about −1.6. Unlike that according to the present disclosure, the conventional structure, when designed for high-speed wiring, may cause significant performance instability and noise due to an inter-layer gap (e.g., air gap).

Figure 19:
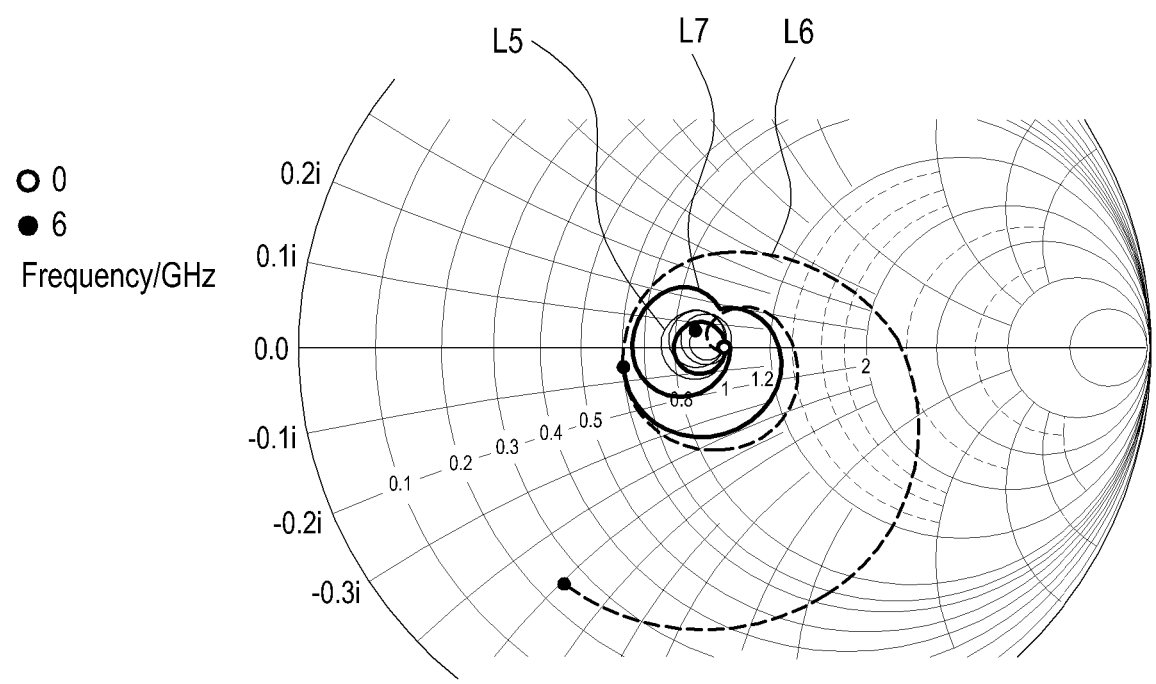
FIG. 19 is a graph of variations in an impedance of a flexible circuit board before and after a rigid-flex circuit board is bent according to an embodiment.

FIG. 19 is a graph illustrating variations in an impedance of a flexible circuit board before and after a rigid-flex circuit board is bent according to an embodiment.

Referring to FIG. 19, the structure of the rigid-flex circuit board may be the same in whole or in part as the structure of the rigid-flex circuit boards 500, 600, and 700 of FIGS. 5A to 12B.

In the flexible circuit board before bent, the plurality of conductive layers may remain stacked over one another without being spaced apart and, when the flexible circuit board is bent, some conductive layers may be warped or agape.

Line L5 may indicate variations in impedance as per frequency bands before the flexible circuit board of the rigid-flex circuit board is bent, and lines L6 and L7 may indicate variations in impedance as per frequency bands after the flexible circuit board of the rigid-flex circuit board is bent.

For example, line L5 may denote variations in impedance where the flexible circuit board is formed in the conventional structure (e.g., the flexible circuit board has a micro-type layout) or in a structure according to the disclosure (e.g., a combination of a CPW type of line path and a micro-strip type of line path and is not bent. For example, line L6 may denote variations in impedance where the flexible circuit board is formed in the conventional structure (e.g., the flexible circuit board has a micro-type layout) and is bent, and line L7 may denote variations in impedance where the flexible circuit board is formed in a structure according to the disclosure (e.g., a combination of a CPW type of line path and a micro-strip type of line path and is bent.

Line L5 shows that as the frequency band varies from 0 GHz to 6 GHz, the impedance remains about 50Ω even though a slight variation is made. Line L6 shows that as the frequency band varies from 0 GHz to 6 GHz, the impedance is drastically lowered from about 50Ω to 20Ω. Line L7 shows that as the frequency band varies from 0 GHz to 6 GHz, the impedance remains about 50Ω.

According to an embodiment, comparison in impedance variation between line L6 and line L7 reveals that even when the flexible circuit board is bent, the structure according to the disclosure (line L7) does not cause a large impedance variation but instead maintains the impedance within a predetermined range (about 50Ω), thus reducing the RF impedance variation despite the deformation of the flexible circuit board, with the result of decreased loss.

According to an embodiment, an electronic device may include a first printed circuit board (PCB) structure and a wireless communication circuit. The first PCB structure may include a first layer, the first layer including a first conductive strip, a second conductive strip electrically separated from the first conductive strip and extending at least partially in parallel with the first conductive strip, and a third conductive strip electrically separated from the first conductive strip, extending at least partially in parallel with the first conductive strip, and formed to dispose the first conductive strip between the second conductive strip and the third conductive strip, and a second layer including a first conductive layer, a first insulating layer disposed to be in contact between a first region of the first layer and a first region of the second layer facing the first region of the first layer, a second insulating layer disposed between a second region of the first layer abutting the first region of the first layer and a second region of the second layer abutting the first region of the second layer and contacting the first layer, and a third insulating layer disposed to be in contact with the second layer between the second insulating layer and the second region of the second layer and separated from the second insulating layer by an air gap. The wireless communication circuit may be electrically connected with the first conductive strip and configured to transmit and/or receive a radio frequency (RF) signal.

The first PCB structure may include at least one first conductive via formed through the first insulating layer and electrically connected between the second conductive strip in the first region of the first layer and the first conductive layer in the first region of the second layer.

The RF signal may have a first wavelength (λ). The first conductive via may be disposed at a selected distance from the second region of the first layer. The selected distance may be not more than ¼ of the first wavelength (¼λ).

The first PCB structure may include a third layer including a second conductive layer to allow the first layer to be disposed between the third layer and the second layer and a fourth insulating layer disposed to be in contact between the first layer and the third layer.

The first PCB structure may include a fifth insulating layer disposed to be in contact between a third region of the first layer and a third region of the second layer facing the third region of the first layer. As viewed from above the first PCB structure, the second region of the first layer may be disposed between the first region of the first layer and the third region of the second layer.

The first PCB structure may include at least one second conductive via formed through the fifth insulating layer and electrically connected between the third conductive strip in the third region of the first layer and the first conductive layer in the third region of the second layer.

The first insulating layer may be formed of a first material, the second insulating layer may be formed of a second material different from the first material, the third insulating layer may be formed of a third material different from at least one of the first material and the second material, the fourth insulating layer may be formed of a fourth material different from at least one of the first material, the second material, and the third material, and the fifth insulating layer may be formed of a fifth material different from at least one of the first material, the second material, the third material, and the fourth material.

The first material may include PPG, the second material may include a black coverlay, the third material may include a coverlay, and the fourth material may include polyimide.

The first material may be the same as the fifth material.

At least part of the second region of the first layer and at least part of the second region of the second layer facing the at least part of the second region of the first layer may be bent or curved.

According to an embodiment, a rigid-flex circuit board may include a rigid circuit board and a flexible circuit board extending from the rigid circuit board and including a plurality of conductive layers and at least one insulating layer disposed between the plurality of conductive layers. The flexible circuit board may include a first layer including a signal line and a ground line spaced apart from the signal line and a second layer forming a ground disposed to face the first layer with the at least one insulating layer disposed therebetween. The rigid circuit board may include at least one conductive via disposed adjacent to the flexible circuit board.

The rigid circuit board may include a first rigid circuit board 510 extending from one end of the flexible circuit board and a second rigid circuit board 520 extending from another end of the flexible circuit board, with the flexible circuit board disposed between the first rigid circuit board and the second rigid circuit board. The at least one conductive via formed in the second rigid circuit board or the first rigid circuit board may be disposed within a ¼ wavelength (¼λ) from an end of the flexible circuit board.

The flexible circuit board may be integrally formed with the first rigid circuit board and the second rigid circuit board. The signal line may extend from the first rigid circuit board through the flexible circuit board to the second rigid circuit board.

The ground line of the flexible circuit board may include a first ground line and a second ground line spaced apart from each other on both sides of the signal line. The signal line may be positioned co-planar with the first ground line and the second ground line.

An interval between the signal line and the first ground line may be the same as an interval between the signal line and the second ground line. The interval may range from 0.05 mm to 0.12 mm.

The signal line formed on the flexible circuit board and the rigid circuit board may be an RF signal line.

The rigid circuit board may include a plurality of conductive layers and at least one insulating layer disposed between the plurality of conductive layers. The plurality of conductive layers may include a first conductive layer provided as an uppermost layer and having a disconnected part along a center line, a second conductive layer formed to allow the signal line to at least partially overlap the disconnected part, a third conductive layer at least partially extending from the second layer of the flexible circuit board, and a fourth conductive layer configured to provide a ground.

The at least one conductive via may include a plurality of via holes passing through from the first conductive layer to the fourth conductive layer. The plurality of via holes may be arranged within the ¼ wavelength (¼λ) from the end of the flexible circuit board. The centers of the plurality of via holes formed in the layers may be arranged along the same line.

The flexible circuit board may further include an upper conductive layer covering at least part of the second layer and the first layer, and wherein the upper conductive layer may include a disconnected part along a center line in a lengthwise direction. The disconnected part may be disposed to overlap at least part of the ground line and the signal line.

The second layer of the flexible circuit board may provide a mesh grid-shaped ground.

The electronic device may further comprise a processor mounted on the first rigid circuit board, an RF transceiver mounted on the first rigid circuit board, and a wireless communication device mounted on the second rigid circuit board. The wireless communication device may be configured to receive, at least, a control signal from the processor and a communication signal from the RF transceiver.

The second rigid circuit board may include a wireless communication circuit mounted on one surface and at least one radiating conductor mounted on the other surface or disposed in an internal space between the one surface and the other surface. The radiating conductor may electrically be connected to the communication device via at least part of the signal line of the flexible circuit board.

According to an embodiment, a rigid-flex circuit board may include a rigid circuit board including at least one conductive via and a flexible circuit board extending from the rigid circuit board and including a plurality of conductive layers. The flexible circuit board may include a first conductive layer including a disconnected part along a center line in a lengthwise direction, a second conductive layer including a signal line and ground lines spaced apart from each other on both sides of the signal line and formed to allow the disconnected part to overlap the signal line, and a third conductive layer disposed under the second conductive layer to provide a ground plane.

The at least one conductive via formed in the rigid circuit board may be disposed within a ¼ wavelength (¼λ) from a border surface between the rigid circuit board and the flexible circuit board.

As is apparent from the foregoing description, according to an embodiment, an electronic device with a rigid-flex circuit board may be implemented to reduce RF impedance variations even though the flexible circuit board region is bent or deformed to reduce loss.

According to an embodiment, an electronic device with a rigid-flex circuit board may include a signal line and ground regions on both sides of, and under, the signal line on some conductive layers in the flexible circuit board region to reduce impedance variations.

According to an embodiment, an electronic device with a rigid-flex circuit board may reduce loss due to reverse bending in the flexible circuit board region and, thus, reduce noise and stabilize radio frequency interference (RFI) and signal integrity even where a high-speed signal line is placed on the circuit board.

It is apparent to one of ordinary skill in the art that the various embodiments of the disclosure as described above are not limited to the above-described embodiments and those shown in the drawings, and various changes, modifications, or alterations may be made thereto without departing from the scope of the disclosure as defined by the appended claims and their equivalents.

What is claimed is:

1. An electronic device, comprising:
   a first printed circuit board (PCB) structure including:
      a first layer including:
         a first conductive strip,
         a second conductive strip electrically separated from the first conductive strip and extending at least partially in parallel with the first conductive strip, and a third conductive strip electrically separated from the first conductive strip and extending at least partially in parallel with the first conductive strip, such that the first conductive strip is between the second conductive strip and the third conductive strip, and a second layer including a first conductive layer;

a first insulating layer interposed between and in contact with a first region of the first layer and a first region of the second layer facing the first region of the first layer;

a second insulating layer interposed between a second region of the first layer abutting the first region of the first layer and a second region of the second layer abutting the first region of the second layer, while contacting the first layer; and a third insulating layer interposed between the second insulating layer and the second region of the second layer, while contacting the second layer, and being separated from the second insulating layer by an air gap; and a wireless communication circuit electrically connected to the first conductive strip and configured to transmit and/or receive a radio frequency (RF) signal.

2. The electronic device of claim 1, wherein the first PCB structure further includes at least one first conductive via formed through the first insulating layer and electrically connected between the second conductive strip in the first region of the first layer and the first conductive layer in the first region of the second layer.

3. The electronic device of claim 2, wherein the RF signal has a first wavelength ($\lambda$), wherein the first conductive via is disposed at a distance from the second region of the first layer, and wherein the distance is equal to less than ¼ of the first wavelength (¼$\lambda$).

4. The electronic device of claim 1, wherein the first PCB structure further includes:

a third layer including a second conductive layer such that the first layer is interposed between the third layer and the second layer; and a fourth insulating layer interposed between and in contact with the first layer and the third layer.

5. The electronic device of claim 4, wherein the first PCB structure further includes a fifth insulating layer interposed between and in contact with a third region of the first layer and a third region of the second layer facing the third region of the first layer, and wherein the second region of the first layer is interposed between the first region of the first layer and the third region of the second layer when viewed from above the first PCB structure.

6. The electronic device of claim 5, wherein the first PCB structure further includes at least one second conductive via formed through the fifth insulating layer and electrically connected between the third conductive strip in the third region of the first layer and the first conductive layer in the third region of the second layer.

7. The electronic device of claim 5, wherein the first insulating layer is formed of a first material, wherein the second insulating layer is formed of a second material different from the first material, wherein the third insulating layer is formed of a third material different from at least one of the first material and the second material, wherein the fourth insulating layer is formed of a fourth material different from at least one of the first material, the second material, and the third material, and wherein the fifth insulating layer is formed of a fifth material different from at least one of the first material, the second material, the third material, and the fourth material.

8. The electronic device of claim 7, wherein the first material includes polypropylene glycol (PPG), the second material includes a black coverlay, the third material includes a coverlay, and the fourth material includes polyimide.

9. The electronic device of claim 7, wherein the first material is the same as the fifth material.

10. The electronic device of claim 1, wherein at least a portion of the second region of the first layer, and at least a portion of the second region of the second layer facing the at least a portion of the second region of the first layer are bent or curved.

11. An electronic device, comprising:

a rigid circuit board; and a flexible circuit board extending from the rigid circuit board and including a plurality of conductive layers and at least one insulating layer disposed between the plurality of conductive layers, wherein the flexible circuit board includes:

a first layer including a signal line and a ground line spaced apart from the signal line; and a second layer forming a ground disposed to face the first layer with the at least one insulating layer disposed therebetween, wherein the rigid circuit board includes:

a first rigid circuit board extending from one end of the flexible circuit board; and at least one conductive via disposed adjacent the flexible circuit board, and wherein the at least on conductive via formed in the first rigid circuit board is disposed within a ¼ wavelength (¼$\lambda$) from an end of the flexible circuit board.

12. The electronic device of claim 11, wherein the rigid circuit board further includes:

a second rigid circuit board extending from another end of the flexible circuit board, with the flexible circuit board disposed between the first rigid circuit board and the second rigid circuit board.

13. The electronic device of claim 12, wherein the ground line of the flexible circuit board includes a first ground line and a second ground line spaced apart from each other on both sides of the signal line, and wherein the signal line is positioned co-planar with the first ground line and the second ground line.

14. The electronic device of claim 13, wherein an interval between the signal line and the first ground line is equal to an interval between the signal line and the second ground line, and wherein the interval between the signal line and the first ground line ranges from 0.05 mm to 0.12 mm.

15. The electronic device of claim 13, wherein the signal line formed on the flexible circuit board and the rigid circuit board is a radio frequency (RF) signal line.

16. The electronic device of claim 15, wherein the flexible circuit board further includes an upper conductive layer covering at least part of the second layer and the first layer, wherein the upper conductive layer includes a disconnected part along a center line in a lengthwise direction, and wherein the disconnected part is disposed to overlap at least part of the ground line and the signal line.

17. The electronic device of claim 15, further comprising:

a processor mounted on the first rigid circuit board;

an RF transceiver mounted on the first rigid circuit board; and a wireless communication device mounted on the second rigid circuit board, wherein the wireless communication device is configured to receive, at least, a control signal from the processor and a communication signal from the RF transceiver.

18. The electronic device of claim 11, wherein the rigid circuit board includes a plurality of conductive layers and at least one insulating layer disposed between the plurality of conductive layers, and the plurality of conductive layers include:

a first conductive layer configured as an uppermost layer and having a disconnected part along a center line;

a second conductive layer formed to cause the signal line to at least partially overlap the disconnected part;

a third conductive layer at least partially extending from the second layer of the flexible circuit board; and a fourth conductive layer configured as a ground.

19. The electronic device of claim 18, wherein the at least one conductive via includes a plurality of via holes passing through from the first conductive layer to the fourth conductive layer, and wherein the plurality of via holes are arranged within the ¼ wavelength (¼λ) from the end of the flexible circuit board.

20. A circuit board, comprising:

a rigid circuit board including at least one conductive via; and a flexible circuit board extending from the rigid circuit board and including a plurality of conductive layers, wherein the flexible circuit board includes:

a first conductive layer including a disconnected part along a center line in a lengthwise direction;

a second conductive layer including a signal line and ground lines spaced apart from each other on both sides of the signal line and formed to cause the disconnected part to overlap the signal line; and a third conductive layer disposed under the second conductive layer as a ground plane, wherein the at least one conductive via formed in the rigid circuit board is disposed within a ¼ wavelength (¼λ) from an end of the flexible circuit board.

* * * * *